US009231211B2

(12) United States Patent
Lee et al.

(10) Patent No.: US 9,231,211 B2
(45) Date of Patent: Jan. 5, 2016

(54) METHOD FOR FORMING A MULTICOLOR OLED DEVICE

(71) Applicants: Cornell University, Ithaca, NY (US); Orthogonal, Inc., Rochester, NY (US)

(72) Inventors: Jin-Kyun Lee, Incheon (KR); Alexander Zakhidov, Ithaca, NY (US); John DeFranco, Ithaca, NY (US)

(73) Assignees: Orthogonal, Inc., Rochester, NY (US); Cornell University, Ithaca, NY (US)

( * ) Notice: Subject to any disclaimer, the term of this patent is extended or adjusted under 35 U.S.C. 154(b) by 0 days.

(21) Appl. No.: 14/524,371

(22) Filed: Oct. 27, 2014

(65) Prior Publication Data

US 2015/0044801 A1   Feb. 12, 2015

Related U.S. Application Data

(63) Continuation of application No. 13/638,062, filed as application No. PCT/US2011/034141 on Apr. 27, 2011, now Pat. No. 8,871,545.

(60) Provisional application No. 61/343,363, filed on Apr. 27, 2010.

(51) Int. Cl.
*H01L 51/00* (2006.01)
*H01L 51/50* (2006.01)
(Continued)

(52) U.S. Cl.
CPC .......... *H01L 51/0016* (2013.01); *G03F 7/0046* (2013.01); *G03F 7/325* (2013.01);
(Continued)

(58) Field of Classification Search
None
See application file for complete search history.

(56) References Cited

U.S. PATENT DOCUMENTS

| 7,718,352 B2 | 5/2010 | Tachikawa et al. | |
|---|---|---|---|
| 2005/0196969 A1* | 9/2005 | Gunner et al. | 438/725 |

(Continued)

FOREIGN PATENT DOCUMENTS

| JP | 2004-134150 A | 4/2004 |
|---|---|---|
| JP | 2007-287537 A | 11/2007 |

(Continued)

OTHER PUBLICATIONS

International Search Report for corresponding International Patent Application No. PCT/US2011/034141 mailed Dec. 29, 2011.
(Continued)

*Primary Examiner* — Daniel Luke
(74) *Attorney, Agent, or Firm* — Merchant & Gould P.C.

(57) ABSTRACT

A method is provided for forming a multi-color OLED device that includes providing a substrate, coating the substrate with a fluorinated photoresist solution to form a first photo-patternable layer and exposing it to produce a first pattern of exposed fluorinated photoresist material and a second pattern of unexposed fluorinated photoresist material, developing the photo-patternable layer with a fluorinated solvent to remove the second pattern of unexposed fluorinated photoresist material without removing the first pattern of exposed fluorinated photoresist material, depositing a first organic light-emitting material over the substrate to form a first organic light-emitting layer for emitting a first color of light and applying the first pattern of exposed fluorinated photoresist material to control the removal of a portion of the first organic light-emitting layer. A second fluorinated photoresist solution is then coated over the first patterned organic light-emitting layer and exposed to form a third pattern of exposed fluorinated photoresist material having a pattern different from the first pattern and a fourth pattern of unexposed fluorinated photoresist material, and developing the photo-patternable layer in a fluorinated solvent to remove the fourth pattern of unexposed fluorinated photoresist material without removing the third pattern of exposed fluorinated photoresist material, depositing at least a second light-emitting material to form a second light-emitting layer for emitting a second color of light that is different than the first color of light and applying the third pattern of exposed fluorinated photoresist material to control the removal of a portion of the second organic light-emitting layer.

11 Claims, 10 Drawing Sheets

(51) Int. Cl.
*G03F 7/004* (2006.01)
*G03F 7/32* (2006.01)
*H05B 33/10* (2006.01)
*H01L 51/56* (2006.01)
*H01L 27/32* (2006.01)

(52) U.S. Cl.
CPC ........ *H01L27/3206* (2013.01); *H01L 51/0018* (2013.01); *H01L 51/504* (2013.01); *H01L 51/56* (2013.01); *H05B 33/10* (2013.01); *H01L 27/3211* (2013.01); *H01L 27/3281* (2013.01)

(56) References Cited

U.S. PATENT DOCUMENTS

2007/0241690 A1* 10/2007 Smith ..................... 315/169.2
2011/0159252 A1   6/2011 Ober et al.

FOREIGN PATENT DOCUMENTS

JP    2010-033925 A      2/2010
KR    10-2005-0051072 A  6/2005
WO    WO 2009/143357 A2  11/2009

OTHER PUBLICATIONS

Taylor, P. et al. "Orthogonal Patterning of PEDOT:PSS for Organic Electronics using Hydrofluoroether Solvents", Adv. Mater., vol. 21, 2009, pp. 2314-2317.

Lee, J. et al. "Acid-Sensitive Semiperfluoroalkyl Resorcinarene: An Imaging Material for Organic Electronics", J. Am. Chem. Soc., vol. 130, 2008, pp. 11564-11565.

Zakhidov, A. et al. "Hydrofluoroethers as Orthogonal Solvents for the Chemical Processing of Organic Electronic Materials", Adv. Mater., vol. 20, 2008, pp. 3481-3484.

* cited by examiner

METHOD FOR FORMING A MULTICOLOR OLED DEVICE

This application is a continuation of U.S. Ser. No. 13/638,062 filed on 23 Apr. 2013, which is a U.S. National Stage Application of PCT/US2011/034141 filed on 27 Apr. 2011, which claims benefit of U.S. Patent Application Ser. No. 61/343,363 filed on 27 Apr. 2010 and which applications are incorporated herein by reference. To the extent appropriate, a claim of priority is made to each of the above disclosed applications.

FIELD OF THE INVENTION

The present invention provides a method for forming a multicolor organic light emitting diode device. More specifically, the present invention provides a method for patterning the light-emitting materials in an organic light emitting diode display or lighting device to form a device capable of presenting multiple colors of light.

BACKGROUND OF THE INVENTION

Displays employing various illumination sources are known in the art. Among these are displays employing a light modulator, such as liquid crystal displays, which are illuminated by a separate light source, typically a fluorescent tube or inorganic light-emitting diode. While displays employing this technology are dominant in today's market they often are much less energy efficient than desired since light is typically emitted in areas of the display even when the light modulator is closed, precluding the light from being observed by the user of the display. Displays which directly modulate the emission of light, such as displays employing Organic Light Emitting Diodes (OLEDs) have the potential to produce light much more efficiently and with higher visual quality. Therefore, OLED displays have the potential to displace LCD displays, especially in markets in which power consumption is a key attribute of the display. These OLED devices can additionally be employed in other devices that require the color of emitted light to be adjusted, including lamps with adjustable color.

Unfortunately, OLED technology, particularly OLED display technology, has been adopted slowly. This slow adoption rate stems primarily from the high cost of producing such displays. In this technology one of the largest challenges is the formation of full-color displays by forming an array of light-emitting elements capable of emitting multiple colors of light. Various approaches to full color have been attempted. Patterning of different colors of material by vapor deposition of organic materials through shadowmasks has proven to be effective. However these shadowmasks limit the resolution of the displays, the size of the substrate that can be successfully coated, and the tact time. Other approaches, such as the use of laser deposition to pattern color emitters has been demonstrated but this technology often produces displays with low yields and often results in significant residual waste. Solution printing of different colored organic emitters has also been discussed but these processes typically result in emitters with significantly lower emission efficiency as compared to emitters deposited by vapor deposition through a shadowmask. This lower efficiency is due to the fact that polymeric materials often have a lower luminescent efficiency and lifetime than small molecule materials and because only a small number of layers can be solution deposited on one another to manage the movement of carriers through the organic layer. Other approaches to forming multicolor OLED devices have also been attempted, including the use of a white emitter together with patterned color filters. However, these approaches also reduce the effective efficiency of the emitters within the OLED display.

In inorganic electronic devices, it is known to apply photolithographic techniques to pattern multiple thin film layers of inorganic semiconductors and inorganic electrically conductive layers with high resolution over large substrates for forming arrays of electrical components. Unfortunately, the photolithographic materials and solvents applied to form these devices are known to dissolve organic materials. Therefore, it is not possible to apply the photolithographic materials and solvents that are known to be used to manufacture inorganic solid state circuits to pattern layers of organic material, especially layers that include active semiconductive organic materials or layers that are formed on top of organic materials.

Recently photoresist materials and solvents have been discussed in the art to facilitate the use of photolithographic techniques to pattern polymeric organic semiconducting layers. For example, Zakhidov et al. in an article published in Advanced Materials in 2008 on pages 3481-3484 and entitled "Hydrofluoroethers as Orthogonal Solvents for the Chemical Processing of Organic Electronic Materials" discusses a method for patterning polymer organic material in which a fluorinated photoresist is deposited on a substrate, selectively exposed to an energy source to render insoluble through deprotection a portion of the photoresist, the photoresist is developed in a solvent including hydrofluoroether to develop the pattern and remove the portion of the photoresist material that was not deprotected. The solubility of the deprotected photoresist in a hydrofluoroether was then reestablished through the use of another solvent. An active organic semiconductor was then deposited over the remaining photoresist and remaining photoresist was lifted off to pattern the active organic semiconductor. As such, this paper demonstrates the patterning of a single solution-coated, polymeric, organic semiconductor on a substrate. The same general process has been discussed by Lee et al. in an article published in the Journal of the American Chemical Society in 2008 on pages 11564 through 11565 and entitled "Acid-Sensitive Semiperfluoroalkyl Resorcinarene: An Imaging Material for Organic Electronics".

Taylor et al. in an article published in Advanced Materials on Mar. 19, 2009 on pages 2314-2317 and entitled "Orthogonal Patterning of PEDOT:PSS for Organic Electronics using Hydrofluoroether Solvents" discusses the formation of a bottom contact thin film transistor in which a polymeric organic conductor (i.e., PEDOT:PSS) is formed on a substrate, a photoresist is formed and patterned over the conductor, the conductor is etched, a second photoresist is applied and patterned before an organic semiconductor (i.e., Pentacene) is applied and patterned.

While each of these papers discuss patterning of solution-coated, polymeric organic materials using a modified photolithographic process and materials to create components in an electrical circuit, the use of processes and materials such as these have not been applied to OLED devices. Further, these papers discuss the application of these materials and processes for use with polymers and do not provide a method for patterning layers of small molecule organic materials. There is therefore a need for a method to produce a multicolor or full-color OLED device on a large substrate. It is especially desirable that this method be applicable to forming highly efficient devices which employ vapor deposited, small molecule organic materials.

SUMMARY OF THE INVENTION

The present invention provides a method for forming an array of two or more organic light-emitting diodes on a large substrate, wherein this method provides high resolution process for patterning two or more light-emitting layers for independently producing two or more colors of light to produce a multicolor OLED device. This method can be applied to form OLED displays, lamps or other emissive devices using polymer light-emitting layers. However, in certain preferred embodiments, this method provides a method forming very high resolution multicolor OLED devices employing highly efficient and long lived small molecule organic materials in a way that is consistent with manufacturing of devices on large substrates.

The method of forming a multi-color OLED device, according to one arrangement of the present invention includes first providing a substrate having a first patterned electrode, coating a photoresist solution over the substrate to form a first photo-patternable layer, wherein the solution includes a fluorinated photoresist material and a first fluorinated solvent, selectively exposing portions of the first photo-patternable layer to radiation to form a first pattern of exposed fluorinated photoresist material and a second pattern of unexposed fluorinated photoresist material, exposing the substrate to a second fluorinated solvent to develop the photo-patternable layer, removing the second pattern of unexposed fluorinated photoresist material without removing the first pattern of exposed fluorinated photoresist material, depositing at least a first organic light-emitting material over the substrate to form a first organic light-emitting layer, and applying the patterns of fluorinated photoresist material to control the removal of a portion of the first organic light-emitting layer to create a pattern of the first light-emitting layer on the substrate. A second patterned light-emitting layer is additionally formed by coating the photoresist solution over the substrate and the remaining first organic light-emitting layer to form a second photo-patternable layer, selectively exposing portions of the second photo-patternable layer to radiation to form a third pattern of exposed fluorinated photoresist material and a fourth pattern of unexposed fluorinated photoresist material wherein the third pattern of exposed fluorinated photoresist material is arranged differently on the substrate than the first pattern of exposed fluorinated photoresist, exposing the substrate to the second fluorinated solvent to develop the photo-patternable layer, removing the fourth pattern of unexposed fluorinated photoresist material without removing the third pattern of exposed fluorinated photoresist material, depositing at least a second light-emitting material over the substrate to form a second light-emitting layer and applying the third pattern of exposed fluorinated photoresist material to control the removal of a portion of the second organic light-emitting layer.

Advantages of the Invention

The present invention provides the advantage that it permits OLED materials to be patterned at high resolution on large substrates to provide multicolor devices. A particularly important advantage is that it provides a method for vapor-deposited, small-molecule, organic materials to be patterned on a substrate to produce a highly efficient, multi- or full color, OLED device. Further this advantage is provided through the use of photolithography of organic materials using fluorinated photoresists and solvents, which are compatible with the organic materials. Therefore, this technique enables the use of photolithographic processes for patterning organic materials on a substrate, permitting photolithographic processes that are currently used to pattern inorganic materials for display backplanes on very large substrates to be extended, such that similar photolithographic processes can be utilized to pattern the organic materials in the light-emitting portion of the device.

DETAILED DESCRIPTION OF THE INVENTION

Figure 1:
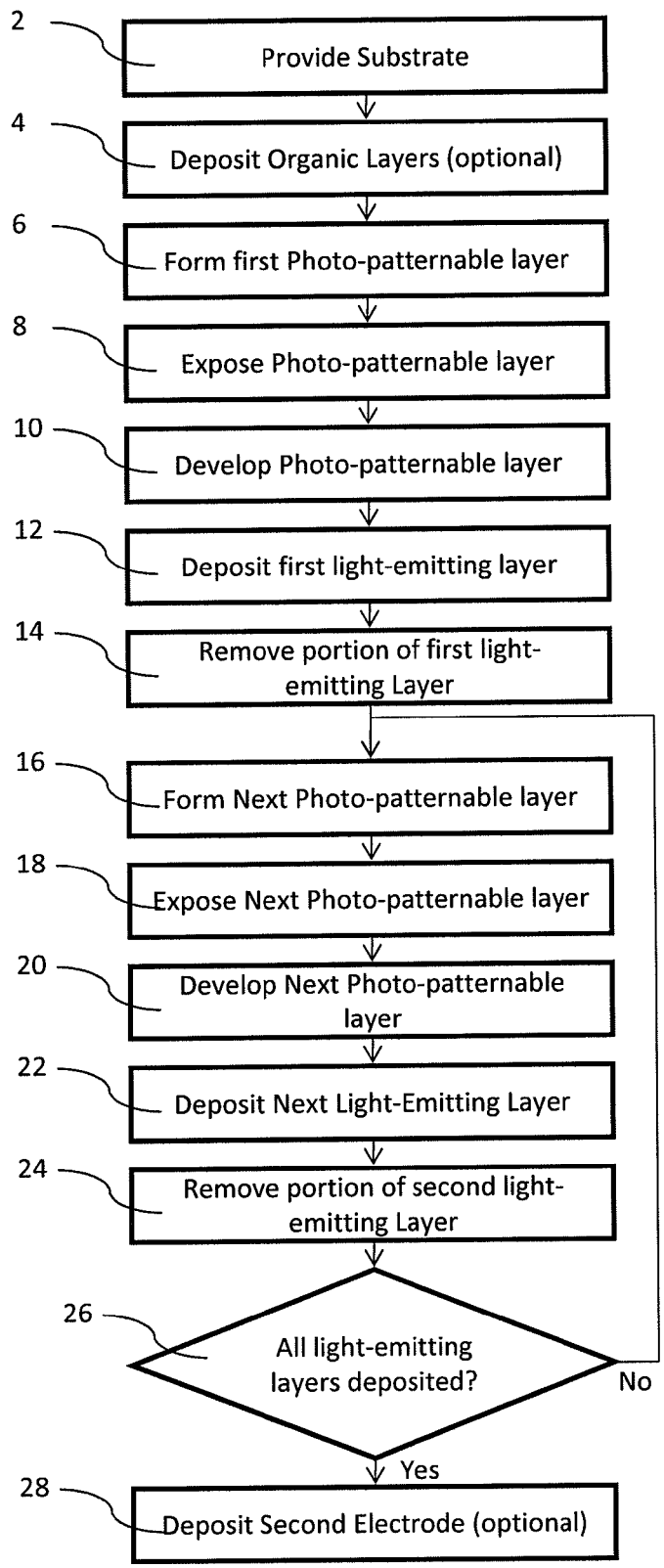
FIG. 1 a flow chart depicting the steps useful in one embodiment of the present invention.

The present invention provides a method for forming a multi-color OLED device. This method is capable of providing very high resolution patterning of differently-colored, light-emitting elements, with each element corresponding to one or more OLEDs, in devices formed on very large substrates. The multi-color OLED device includes two or more independently-controlled, light-emitting elements for independently emitting two or more colors of light. This method is applicable to devices formed based upon polymer OLED devices but is especially desirable for forming small molecule OLED devices, including OLED devices formed through vapor deposition of multiple organic light-emitting layers on a single substrate. This method utilizes photolithographic techniques that employ fluorinated photoresists with fluorinated solvents to produce these multi-color OLED devices. This method is performed using steps that protect the OLED from contamination by oxygen or moisture to provide a device having a high efficiency.

In embodiments of the present invention, multiple light-emitting layers, each light-emitting layer for emitting a different color of light, will be deposited on a single substrate to form multiple light emitting elements. These light-emitting elements will emit at least a first color of light and a second color of light, wherein the second color of light is different from the first color of light. As such, the device will be capable of providing multiple colors of light. In more preferred embodiments, the method will be applied to form an OLED device that will further include light-emitting elements for emitting at least a third color of light that is different from the first or second color of light. Further, the first, second, and third color of light will preferably include at least red, green, and blue colors of light, to form a full-color OLED device.

The method of the present invention includes first providing 2 a substrate having a first electrode. In preferred embodiments, this first electrode will be patterned to include at least a first and a second independently-controllable, first electrode segment. In passive matrix driven OLED devices, this electrode will be pattern into stripes oriented along a first dimension, wherein each stripe is an independently-controllable first electrode segment. In active matrix driven OLED devices, this electrode can be patterned into a two-dimensional array of independently-controlled electrode segments. These independently-controlled electrodes can be connected to individual circuits, typically thin-film transistors formed on the substrate such that the first electrode segments connected to an individual circuit will correspond to a unique light-emitting element.

In some embodiments, organic layers, including carrier injection, carrier transport, or other organic layers that are common among multiple colors of light-emitting elements of the device can be deposited 4 directly onto the substrate. Optionally, these organic layers can be deposited simultaneously with the light-emitting materials as described later. When these organic layers are deposited 4 onto the substrate before the light-emitting layers, the substrate can be placed into a vacuum and small molecule organic materials can be vapor deposited onto the substrate. Alternatively small molecule, oligomers or polymers can be solution coated onto the substrate. Regardless of the deposition technique, the organic layers will preferably be blanked coated onto the substrate. Alternatively, the materials can be coarsely patterned onto the substrate.

In a first embodiment involving liftoff of the organic light-emitting layer, a photoresist solution is coated over the substrate and any organic layers deposited during step 4 to form 6 a first photo-patternable layer. The photo-patternable layer is then exposed 8 to radiation to form a first pattern of exposed fluorinated photoresist material and a second pattern of unexposed fluorinated photoresist material and the photo-patternable layer is developed 10 to remove the second pattern of unexposed fluorinated photoresist material. A first organic light-emitting layer is then deposited 12 over the first pattern of exposed fluorinated photoresist material. In a second embodiment, involving etching of the organic light-emitting layer, the order of these steps is altered. In this second embodiment, the first organic light-emitting layer is deposited 12 directly over the substrate, such that at least a portion of this light-emitting layer is in direct electrical contact with the first electrode or the organic layers deposited during optional step 4. A photoresist solution is then coated over the substrate, any organic layers deposited during optional step 4 and the first organic light emitting layer to form 6 the first photo-patternable layer. The photo-patternable layer is then exposed 8 to radiation to form a first pattern of exposed fluorinated photoresist material and a second pattern of unexposed fluorinated photoresist material and the photo-patternable layer is developed 10 to remove the second pattern of unexposed fluorinated photoresist material. In either embodiment, a pattern is formed in the first photo-patternable layer that is composed of a fluorinated photoresist and this pattern is then applied to control the removal of a portion of a light-emitting layer.

In either the first or second embodiment, the first photo-patternable layer is formed from a solution containing a fluorinated photoresist material and a first fluorinated solvent having a first boiling point and is coated over the substrate in an environment that is preferably clean from particulates and moisture, but is performed at near atmospheric pressure. The environment will preferably contain nitrogen or another inert gas to prevent any contamination but can also be an environment containing air, preferably at low humidity. If organic layers have already been formed on the substrate, it is desirable to perform this coating step within an aqueous-free and oxygen free environment, for instance an aqueous-free nitrogen environment. After the photo-patternable layer is formed 6, the substrate will be placed into an oven and baked at a temperature approaching the boiling point of the first fluorinated solvent. It should be noted that once the substrate is coated with the photoresist solution, it is not necessary that the substrate be contained within an aqueous-free or very low humidity environment since the fluorinated photoresist materials are hydrophobic and will repel moisture, thus protecting any underlying organic materials or reactive metals from this moisture. As such, this photo-patternable layer can serve as an in-process encapsulation layer.

The photo-patternable layer is then selectively exposed 8 to radiation, such that a first portion of the photo-patternable layer is exposed to radiation while a second portion of the photo-patternable layer is not exposed to radiation. The substrate is then heated again to further bake the photo-patternable layer. Through this process, a first pattern of exposed fluorinated photoresist material and a second pattern of unexposed fluorinated photoresist material are formed wherein the first pattern of the photo-patternable layer is hardened such that it will not dissolve in a fluorinated solvent as rapidly as the second pattern of unexposed fluorinated photoresist material. These patterns are formed such that regions of the substrate, specifically selected first electrode segments, that are intended to be covered with the first light-emitting layer are aligned with the second pattern of unexposed fluorinated photoresist material and regions of the substrate, specifically selected first electrode segments, that are not intended to be covered with the first light-emitting layer are aligned with the first pattern of exposed fluorinated photoresist material.

The substrate, including the photo-patternable layer, is then exposed to a second fluorinated solvent to develop 10 the photo-patternable layer after it has been exposed 8. This process removes the second pattern of unexposed fluorinated photoresist material without removing the first pattern of exposed fluorinated photoresist material. As such, the underlying structure, more specifically, the selected first electrode segments or optionally deposited 4 organic layers are exposed in the first embodiment employing liftoff and the organic layers including the first organic light-emitting layer are exposed for the second embodiment employing etching.

Organic materials, including at least a first organic light-emitting material, are deposited 12 over the substrate to form a first light-emitting layer for emitting a first color of light. Preferably this deposition process includes blanket coating the organic materials over the substrate to form an organic layer. This deposition process can include processes such as hopper or spin coating of solutions containing organic light-emitting materials over the substrate. Preferably, this process will be completed within an aqueous-free and oxygen free environment. More preferably, the deposition process will include introducing the substrate into a vacuum environment and evaporating small molecule organic materials onto the substrate. In embodiments wherein carrier injection or carrier transport layers have not been previously coated over the substrate, the organic materials can include a first carrier injection or a first carrier transport layer, which are deposited over the substrate before the light-emitting layer. Other organic materials can additionally be applied. For instance an additional layer of carrier transport material can be coated before the light-emitting layer to tune the thickness of the OLED emitter. Additionally, a second, complimentary carrier transport or carrier injection layer can be formed over the light-emitting layer. In some embodiments, an inorganic conductor or spacer can be coated either before or after the organic materials forming the first light-emitting layer are deposited.

The first organic light-emitting layer is then patterned by applying the first pattern of exposed fluorinated photoresist material to control the removal 14 of a selected portion of the first light-emitting layer. In the first embodiment employing liftoff, this step 14 includes exposing the substrate to a third solvent containing a fluorinated solvent to remove or liftoff the first pattern of exposed fluorinated photoresist material and the organic materials which were deposited over the first pattern of exposed fluorinated photoresist material, including at least the portion of the first light emitting layer deposited over this first pattern of exposed fluorinated photoresist material. To perform this step, the substrate can be immersed in the third solvent and once again moved to an aqueous-free environment with near atmospheric pressure to dry. During this step, not only the first pattern of exposed fluorinated photoresist material but additionally the organic materials that were deposited on top of this first pattern of exposed fluorinated photoresist material are removed from the substrate. As such, only the portion of the first light-emitting layer for emitting the first color of light that was directly deposited on the substrate or the first electrode remains on the substrate. That is, only the portion of the first light-emitting layer that is deposited in the area that was covered by the second pattern of unexposed photoresist material remains. As such, the first pattern of exposed fluorinated photoresist material is applied to control the removal 14 of a selected portion of the first light-emitting layer. This portion of the substrate will therefore contain light-emitting elements for emitting the first color of light. In the second embodiment employing etching this step 14 includes exposing the substrate to an etching process, such as an $O_2$ plasma etch, to transfer the second pattern of unexposed fluorinated photoresist material to the organic light-emitting layer. In this process, the remaining first pattern of exposed fluorinated photoresist material protects the portion of the organic light-emitting layer with which it is in direct contact by absorbing the energy from the etching process. However, the portion of the organic light-emitting layer within the region previously occupied by the second pattern of unexposed fluorinated photoresist material is removed by the etching process, patterning 14 the light-emitting layer.

Steps 6 through 14 are then generally repeated to form a second patterned organic light-emitting layer. The second light-emitting layer can once again be patterned by a first embodiment involving liftoff or a second embodiment involving etching. Once again if the first embodiment involving liftoff of the organic light-emitting layer is applied, a photoresist solution is coated over the substrate to form 16 a second photo-patternable layer. The photo-patternable layer is then exposed 18 to radiation to form a third pattern of exposed fluorinated photoresist material and a fourth pattern of unexposed fluorinated photoresist material. The photo-patternable layer is developed 20 to remove the fourth pattern of unexposed fluorinated photoresist material. A second organic light-emitting layer is then deposited 22 over the first pattern of exposed fluorinated photoresist material. In the second embodiment, involving etching of the second organic light-emitting layer, the order of the steps is altered. In the second embodiment involving etching, the second organic light-emitting layer is deposited 22 directly over the substrate, such that at least a portion of the second organic light-emitting layer is in direct electrical contact with the first electrode or the organic layers deposited during optional step 4. A photoresist solution is then coated over the substrate, any organic layers deposited during optional step 4 and the second organic light-emitting layer to form 16 the second photo-patternable layer. The photo-patternable layer is then exposed 18 to radiation to form a third pattern of exposed fluorinated photoresist material and a fourth pattern of unexposed fluorinated photoresist material and the photo-patternable layer is developed 20 to remove the fourth pattern of unexposed fluorinated photoresist material.

The first photoresist solution applied during step 16 will typically be the same photoresist solution as described earlier and applied during step 6 but this is not required and the solution can be a different solution having a different chemical composition. However, this photoresist solution will once again contain a fluorinated photoresist in a fluorinated solvent. It is desirable to perform this coating step within an aqueous-free and oxygen free environment, for instance an aqueous-free nitrogen environment. The substrate will then be placed into an oven and baked at a temperature less than the boiling point of the first fluorinated solvent.

Portions of the second photo-patternable layer are selectively exposed 18 to radiation to form a third pattern of exposed fluorinated photoresist material and a fourth pattern of unexposed fluorinated photoresist material after this next photo-patternable layer is formed 16. The arrangement of the third pattern of exposed fluorinated photoresist material on the substrate is different from the arrangement of the first pattern of exposed fluorinated photoresist material on the substrate. Further, the arrangement of the fourth pattern of unexposed fluorinated photoresist materials is different from the arrangement of the second pattern of unexposed fluorinated photoresist material on the substrate. In some embodiments, the arrangement of the third pattern of exposed fluorinated photoresist material on the substrate can be different than the arrangement of the second pattern of unexposed fluorinated photoresist material on the substrate. However, having the second and third pattern of exposed fluorinated photoresists with common arrangements can be desirable, for instance, when forming a device having light-emitting elements for emitting only two colors of light. However, this is not required and in some embodiments, it is desirable for the arrangement of the third pattern of exposed fluorinated photoresist material to be different than the arrangement of the second pattern of unexposed fluorinated photoresist material on the substrate. Once these patterns have been formed, the substrate is heated again to further bake the photo-patternable layer. Through this process, the third pattern of exposed fluorinated photoresist material is hardened such that it will not dissolve in a fluorinated solvent as rapidly as the fourth pattern of unexposed fluorinated photoresist material. These patterns are formed such that regions of the substrate that are intended to be covered with the second light-emitting layer are aligned with the second pattern of unexposed fluorinated photoresist material.

The substrate is then exposed to the second fluorinated solvent to develop 20 the second photo-patternable layer. Application of this solvent removes the fourth pattern of unexposed fluorinated photoresist material without removing the third pattern of exposed fluorinated photoresist material. Once exposed to this second fluorinated photoresist material, the substrate is permitted to dry in an aqueous-free, oxygen-free environment at near atmospheric pressure.

The second organic light emitting layer that is deposited 22 is different from the first organic light-emitting layer in that the molecules that are applied in the second organic light-emitting layer provide light having a different spectral content than the molecules applied in the first organic light-emitting layer when undergoing electroluminescence.

Therefore, the organic molecules in the second organic light-emitting layer are selected such that they produce a different color of light than the organic molecules in the first organic light-emitting layer.

Preferably this deposition 22 includes blanket coating the organic materials over the substrate to form an organic light-emitting layer. This deposition 22 can include processes such as hopper or spin coating of solutions containing organic light-emitting materials over the substrate. Preferably, this deposition 22 will be completed within an aqueous-free and oxygen free environment. However, more preferably, the deposition 22 will include introducing the substrate into a vacuum and evaporating small molecule organic materials onto the substrate. In embodiments wherein the second photo-patternable layer was not deposited over carrier injection or carrier transport, the organic materials can include a first carrier injection or a first carrier transport layer, which are deposited over the substrate before the light-emitting layer. Other organic materials can additionally be applied. For instance an additional layer of carrier transport material can be coated before the light-emitting layer to tune the thickness of the OLED emitter. Additionally, a second, complimentary carrier transport or carrier injection layer can be formed over the second light-emitting layer. Finally in some embodiments, an inorganic conductor or spacer can be coated either before or after the organic materials forming the first light-emitting layer are deposited.

The second organic light-emitting layer is then patterned by applying the third pattern of exposed fluorinated photoresist material to control the removal 24 of a selected portion of the second light-emitting layer. In the first embodiment employing liftoff, this step 24 includes exposing the substrate to a third solvent containing a fluorinated solvent to remove or liftoff the third pattern of exposed fluorinated photoresist material and the organic materials which were deposited over the third pattern of exposed fluorinated photoresist material, including at least the portion of the second organic light-emitting layer deposited over this third pattern of exposed fluorinated photoresist material. To perform this step, the substrate can be immersed in the third solvent and once again moved to an aqueous-free environment with near atmospheric pressure to dry. During this step, not only the third pattern of exposed fluorinated photoresist material but additionally the organic materials that were deposited on top of this first pattern of exposed fluorinated photoresist material are removed from the substrate. As such, only the portion of the first light-emitting layer for emitting the second color of light that was directly deposited on the substrate or the first electrode remains on the substrate. That is, only the portion of the first light-emitting layer that is deposited in the area that was covered by the fourth pattern of unexposed photoresist material remains. This portion of the substrate will therefore contain light-emitting elements for emitting the second color of light. In the second embodiment employing etching this step 24 includes exposing the substrate to an etching process, such as an $O_2$ plasma etch, to transfer the fourth pattern of unexposed fluorinated photoresist material to the second organic light-emitting layer. In this process, the remaining third pattern of exposed fluorinated photoresist material protects the portion of the organic light-emitting layer with which it is in direct contact by absorbing the energy from the etching process such that the third pattern of exposed fluorinated photoresist material is applied to control the removal of a selected portion of the second light-emitting layer. In this process, the portion of the organic light-emitting layer within the region previously occupied by the fourth pattern of unexposed fluorinated photoresist material is removed by the etching process, patterning 24 the second light-emitting layer.

Note that, regardless of whether the first or second embodiments are employed, the device includes at least a first organic light-emitting layer for emitting a first color of light and a second organic light-emitting layer for emitting a second color of light a portion of which is selectively removed 14, 24 permitting the remaining portions to be formed in direct electrical contact with different first electrode segments to form different, independently controllable light-emitting elements. In this device the relative intensity or relative activation time for each light-emitting element in the device can be adjusted to adjust the relative intensity of the light-emitting elements for emitting the first color of light with respect to the intensity of the light-emitting elements for emitting the second color of light. As such, the device can be capable of creating light not only having the chromaticity coordinates of the first or second colors of light but can produce light having a range of chromaticity coordinates between the chromaticity coordinates of the first and second color of light. Such an arrangement can be particularly useful when the first and second colors of light are complimentary. Further it is desirable for one of the first or second colors of light to be a secondary color.

In other embodiments of the present invention, the device will include at least three different light-emitting layers for emitting at least three different colors of light, including at least light-emitting layers for forming light-emitting elements that emit red, green, and blue light. Therefore, such a device can be constructed to provide a full-color OLED display or a lamp with fully adjustable color. Since each organic light-emitting layer can consist of small molecule OLED materials and can be deposited using vapor deposition, this device can provide a very high efficiency but because the materials are patterned using photolithographic methods, the full color device can be provided on a very large substrate and at very high resolution. In devices requiring more than two light-emitting layers for emitting more than two colors of light, after depositing 22 the second light-emitting layer and patterning 24 the second organic light-emitting layer, a decision 26 is made as to whether all of the organic light-emitting layers have been deposited. If they have not been deposited, steps 16 through 26 as shown in FIG. 1, are repeated until all of the organic light-emitting layers and the organic semiconductor portions of each light-emitting element within the device have been formed. During these steps, the third pattern of exposed fluorinated photoresist material and the fourth pattern of unexposed fluorinated photoresist material have a different spatial arrangement on the substrate to define a unique location on the substrate for deposition of each additional organic light-emitting layer to produce independently-controllable light-emitting elements.

Once the decision 26 has been made that all of the light-emitting layers have been deposited, a second electrode can be deposited 28 to complete each of the organic light-emitting diodes within the device. Note that in some embodiments, this step can be optional as it is possible to coat a portion of the second electrode as a step within the deposit 22 next light-emitting layer step. That is, portions of the second electrode could potentially be patterned over the substrate after each light-emitting layer is deposited. However, more typically, the second electrode will be deposited 28 after all of the light-emitting layers have been deposited 26 and patterned.

The method as described permits the formation of a multi-color OLED device by first providing 2 a substrate having a first patterned electrode. Coating a photoresist solution over the substrate to form 6 a first photo-patternable layer, wherein the solution includes a fluorinated photoresist material and a first fluorinated solvent. The first photo-patternable layer is then selectively exposed 8 to radiation to form a first pattern of exposed fluorinated photoresist material and a second pattern of unexposed fluorinated photoresist material. The substrate is then exposed to a second fluorinated solvent to develop 10 the photo-patternable layer, removing the second pattern of unexposed fluorinated photoresist material without removing the first pattern of exposed fluorinated photoresist material. At least a first organic light-emitting material is deposited 12 over the substrate to form a first organic light-emitting layer. A portion of the first organic light-emitting layer is then removed 14 to pattern the first light-emitting layer by applying the first pattern of exposed fluorinated photoresist material to select the portion of the first organic light-emitting layer that is removed 14. The photoresist solution is once again coated over the substrate and the remaining first organic light-emitting layer to form 16 a second photo-patternable layer. Portions of the second photo-patternable layer are selectively exposed 18 to radiation to form a third pattern of exposed fluorinated photoresist material and a fourth pattern of unexposed fluorinated photoresist material wherein the third pattern of exposed fluorinated photoresist material is arranged differently on the substrate than the first pattern of exposed fluorinated photoresist. The substrate is exposed to the second fluorinated solvent to develop 20 the photo-patternable layer, removing the fourth pattern of unexposed fluorinated photoresist material without removing the third pattern of exposed fluorinated photoresist material. At least a second light-emitting material is deposited 22 over the substrate to form a second light-emitting layer. Finally, a portion of the second organic light-emitting layer is removed 24 by applying the third pattern of exposed photoresist material to control the portion of the second organic light-emitting layer that is removed 24.

According to a first specific embodiment, the first light-emitting layer is deposited 12 over the first developed photo-patternable layer and the second light-emitting layer is deposited over the second photo-patternable layer. As such, the first photo-patternable layer is formed 6, exposed 8 and developed 10 before the first light-emitting layer is deposited 12 and the second photo-patternable layer is formed 16, exposed 18, and developed 20 before the second light-emitting layer is deposited 22. Further, the steps of removing 14 a portion of the first organic light-emitting layer and removing 24 a portion of the second organic light-emitting layer includes exposing the substrate to a third solvent to remove the exposed fluorinated photoresist material and the portion of the first and second light-emitting layers in direct contact with the exposed first and second photo-patternable layer, such that at least a portion of the remaining portions of the first and second light-emitting layers are each in electrical contact with the first patterned electrode.

According to a second specific embodiment, the first photo-patternable layer is deposited 6 over the first light-emitting layer and the second photo-patternable layer is deposited 16 over the second light-emitting layer. That is, the first light emitting layer is deposited 12 on the substrate and the first photo-patternable layer is formed 6 over the first light-emitting layer. Likewise, the second light-emitting layer is deposited 22 over a portion of the first light-emitting layer and the second photo-patternable layer is formed 14 over the second light-emitting layer. According to this embodiment, the steps of removing 14 a portion of the first organic light-emitting layer and removing 24 a portion of the second organic light-emitting layer includes transferring the pattern of the second pattern of unexposed fluorinated photoresist material and the fourth pattern of unexposed fluorinated photoresist material by applying an etching step. Further, this second specific embodiment will typically include exposing the substrate to a third solvent to remove at least the first and third patterns of exposed photoresist materials from the substrate. Notice that in this embodiment, a portion of the first light-emitting layer is removed before the second organic light-emitting layer is deposited, permitting a portion of the second organic light-emitting layer to be in direct electrical contact with a segment of the first electrode.

In each embodiment, the remaining portions of the first and second light-emitting layers are typically, each in direct electrical contact with unique first electrode segments. That is, the materials that are present between the first electrode and each light-emitting layer permit the flow of carriers from the electrode to the light-emitting layer without requiring these carriers to travel through an intervening light-emitting layer. Note that this also implies that any fluorinated photoresist material applied before a light-emitting layer that is in direct electrical contact with a segment of the first electrode is removed before the light-emitting layer is deposited as this fluorinated photoresist material generally serves as an insulator and will therefore prevent the flow of carriers and the formation of a direct electrical contact.

Within this disclosure, the term "multi-color device" refers to an organic light-emitting diode device having at least two light-emitting elements arranged adjacent to one another wherein each light-emitting element emits light which varies as a function of wavelength to form a spectrum of light and wherein the spectrum of light output by the two light-emitting elements is different from one another. In preferred embodiments, these light-emitting elements are independently controllable, however, this is not required in embodiments of the present invention. In this device, the two light-emitting elements produce light as a result of electroluminescence and the light that is created differs in color between the two light-emitting elements. Within this context the term "light" refers specifically to electromagnetic energy that is created in the visible or infrared portions of the electromagnetic spectrum. Therefore, one light-emitting element of the multi-color device can emit energy at wavelengths in the visible spectrum, resulting in a first spectral energy profile or spectrum, while the adjacent light-emitting element can emit energy at wavelengths in the visible or infrared portions of the electromagnetic spectrum, resulting in a second spectral energy profile, wherein the first spectral energy profile is different from the second spectral energy profile. A multi-color device is not limited to having only light-emitting elements for emitting electromagnetic energy with two different spectral energy profiles but can also include three or more light-emitting elements, each for emitting electromagnetic energy with different spectral energy profiles or spectra. Further, within preferred embodiments of the present invention, the multi-color device will preferably include a two-dimensional array of each light-emitting element having each of the different spectral energy profiles or spectra.

The term "substrate" refers to any support on which organic materials can be coated to provide structural integrity. Substrates known in the art include rigid substrates, such as those typically formed from glass, and flexible substrates, such as typically formed from stainless steel foil or plastic. The substrate can also provide a portion of an environmental barrier to protect the organic material from moisture or oxygen, but this is not required. The substrate can be opaque, transparent or semitransparent. The substrate can further include one or more inorganic layers, such as metal bus lines or inorganic semiconductor materials for conducting electricity to the organic device. The substrate can include nonconductive layers of organic material to perform functions, such as insulating the active organic layer from the substrate or conductive elements on the substrate. Nonconductive organic layers can also be included as part of the substrate when these layers are provided to smooth the surface of the substrate to permit a uniform layer of active organic materials to be formed.

The term "electrode" within the present invention refers to layer or a combination of multiple thin film layers which functionally provide a single conductive layer capable of creating an electrical field within the organic semiconductor layers of the device. An electrode can be transparent, semi-transparent, or opaque. However, at least one of a first or second electrode in devices of the present invention will be transparent or semi-transparent. Often one of the first or second electrodes within devices of the present invention will be opaque and reflective. Typical electrodes useful in embodiments of the present invention will have a thickness of between 10 and 300 nm. Electrodes can be formed from organic or inorganic materials capable of conducting electricity to create an electric field within the organic semiconductor layers of the light-emitting elements of the present invention. Typical inorganic materials useful in forming an electrode will include metals such as silver, gold, platinum, copper, molybdenum and aluminum; as well as certain doped metal oxides, such as indium tin oxide or indium zinc oxide. Electrodes can be formed using multiple methods including printing or sputtering. However, it is desirable in certain embodiments to deposit the inorganic materials to form an electrode using evaporation or other methods that provide line of sight deposition. Organic materials useful in forming an electrode include highly ordered polymers, such as PEDOT/PSS. Electrodes can be formed using numerous methods, including printing methods. However, to increase deposition speed and decrease process time, it is preferred that the material used to form electrodes, especially the material used to form the second electrode be deposited using blanket-coating methods to form a continuous film over the substrate.

The term "patterned electrode" refers specifically to electrodes that are segmented across the substrate such that each segment of the electrode is shared by one or more light-emitting elements but all light-emitting elements on the substrate do not share the same segment of the electrode. That is, the flow of current through any two segments of the electrode can be independently controlled to independently control the flow of current through light-emitting elements that are in contact with each segment.

The term "near atmospheric pressure" refers to an environment that is not a vacuum. When vapor depositing small molecule OLEDs to obtain high efficiency and lifetime in embodiments of the present invention, it is important to remove the substrate from the vacuum to form 6, 16 the photo-patternable layers, expose 8, 18 the photo-patternable layers, develop 10,20 the photo-patternable layers, and liftoff 14, 24 the photo-patternable layers. Therefore, these operations must be performed at "near atmospheric pressure". This term therefore applies to environments with between 0.01 Torr and 1000 Torr of pressure, more preferably between 1 and 1000 Torr of pressure and more preferably between 100 and 1000 Torr of pressure. Alternatively, "vacuum" refers to an environment with an atmospheric pressure significantly less than 0.01 Torr and commonly less than $10^{-4}$ Torr.

The term "organic material" in the present invention generally refers to organic semiconductor materials appropriate for use within an OLED. These organic materials often facilitate functions, such as electron injection, electron and hole transport, electron or hole blocking, connection of organic bilayers or light emission. Highly efficient and long-lived organic light emitting diodes often include several layers to balance the transport of "carriers" (i.e., holes or electrons), between the electrodes and through the diode such that recombination of these holes and electrons occur within the light-emission layer, resulting in efficient light creation. Therefore, a high quality, vacuum-coated OLED will typically require the deposition of multiple layers of organic material over the first electrode before deposition of the light-emitting layer and the deposition of multiple layers of organic material over the light-emitting layer. In some arrangements, only a subset of these layers or only the light-emitting layer will be patterned through the photolithographic steps (e.g., steps 6, 8, 10, 14, 16, 18, 20, 24 of FIG. 1). In other arrangements, all of the organic layers will be patterned through the photolithographic steps. In yet other embodiments at least the light-emitting layer and all subsequent layers, including the second electrode will be patterned through the photolithographic steps. It should be noted that OLED molecules for emitting light as a result of trapping an electron as a singlet or triplet are well known in the art and device structures can employ light-emitting elements containing light-emitting layers containing singlet emitters, triplet emitters or combinations thereof. A "light-emitting layer" is defined as an organic material layer that emits light in response to an electric field the electroluminescence within an OLED of the present invention. These "light-emitting layers" will often contain one or more dopant molecules that will be responsible for converting the energy from a trapped electron-hole pair into a photon which is emitted to provide light.

As stated parenthetically, a "carrier" refers to either a hole or electron. The term "complimentary carrier" then refers to the other of the hole or electron. That is, if a carrier layer is an electron transport layer, the complimentary transport layer is the hole transport layer.

The fluorinated photoresist material can be a resorcinarene, a random copolymer of perfluorooctyl methacrylate with 2-nitrobenzyl methacrylate (to form "FOMA-NBMA"), a random copolymer of perfluorooctyl methacrylate with tert-butyl methacrylate (to form "FOMA-TBMA"), a random copolymer of perfluorodecyl methacrylate with 2-nitrobenzyl methacrylate (to form "FDMA-NBMA"), a random copolymer of perfluorodecyl methacrylate with tert-butyl methacrylate (to form "FDMA-TBMA"), block copolymers of FOMA-NBMA, FOMA-TBMA, FDMA-NBMA, FDMA-TBMA, derivatives thereof or other polymer photoresist or molecular glass photoresist having sufficient content to permit the photoresist to be dissolved in a fluorinated solvent such as a solvent formed from a hydrofluorether. This fluorinated photoresist can be solubulized in a hydrofluoroether such as methyl nonafluorobutyl ether and then coated onto a substrate of the present invention. The solvent can then be evaporated to form a photo-patternable layer. This first solvent will typically also include a photo-acid generator, for example N-hydroxynaphthalamide perfluorobutylsulfonate or other known photo-acid generator. In the presence of proper exposure, this photo-acid generator will liberate H+, which will react with the fluorinated photoresist material to transform it into an insoluble form. These materials and their use in conjunction with fluorinated solvents for performing photolithographic steps have been discussed in more detail in a co-pending document with the serial number PCT/US09/44863 and entitled "Orthogonal Processing of Organic Semiconductors," the contents of which is incorporated in its entirety herein.

In a preferred (but non-limiting) embodiment this photoresist can be a material composed of a copolymer of 1H,1H,2H,2H-perfluorodecyl methacrylate (FDMA) and tert-butyl methacrylate (TBMA). This material was found to have a high fluorine content to make it soluble in fluorinated solvents of the present invention. This statistical copolymer of FDMA and TBMA was prepared by free radical polymerization under a nitrogen atmosphere. A 25 ml round bottom flask equipped with a stir bar was filled with 1.4 g of FDMA, 0.6 g of TBMA, 0.01 g of AIBN and 2 ml of trifluorotoluene as a solvent. After polymerization, the reaction mixture was poured into hexane to precipitate the polymer and then filtered and dried under vacuum. The molecular weight of the copolymer was determined to be 30400 by size-exclusion chromatography and the molar composition of FDMA:TBMA was found to be 35 mol %:65 mol % using 1H NMR (Varian Inova-400 spectrometer) analysis with $CDCl_3$—$CFCl_3$ (v/v—1:3.5) as a solvent. The FDMA component of the resist is responsible for the solubility of the copolymer in fluorinated solvents whereas the TBMA groups in the unexposed regions make the copolymer less polar in the butyl-protected state. Upon exposure to a photogenerated acid, these protecting groups undergo a chemically amplified deprotection reaction. The resulting polar methacrylic acid (MAA) units decrease copolymer solubility in fluorinated solvents. After the photo-patternable layer 26 is formed from this material together with a photoacid generator and exposed 8, the exposed pattern can be treated with a solubilizing agent, for example a silazine such as HMDS. This treatment re-protects the P(FDMA-co-MAA) film with siloxane groups and makes it soluble within fluorinated solvents to facilitate its removal for liftoff.

In another preferred (but non-limiting) embodiment the photoresist can be a copolymer of FOMA and TBMA. For example, a solution of 110.10 g (0.7743 mol.) of tert-butyl methacrylate, (TBMA), 330.07 g (0.7636 mol.) of 1H,1H,2H,2H-perfluorooctyl methacrylate, ("FOMA"), 874.2 g of Novec 7600 and 5.51 g (0.0335 mol.) of azobisisobutyronitrile, ("AIBN") was stirred in a jacketed reaction flask. The flask jacket was connected to a programmable, constant temperature bath ("CTB") capable of heating and maintaining a set jacket temperature. The solution was sparged with nitrogen at a rate of 0.5 L/minute for 1 hour at ambient temperature. A CTB program was initiated which heated the reaction jacket to 68° C., holds this temperature for 1 hour, heats to 72° C. and holds for 1 hour, and finally heats to 76° C. and holds for 12 hours. When the heating program was completed, the CTB was set to cool the reaction mixture to ambient temperature. The clear, colorless polymer solution obtained was diluted to a viscosity target by the addition of 3.714 kg of Novec™ 7600, and a small sample was removed and dried under vacuum for later characterization. In one embodiment, under yellow lights, 22.0 g of CIBA/BASF CGI-1907 photo acid generator ("PAG") (5% by weight of the original dry weight of TBMA) was dissolved in the remaining photoresist solution. The solution was filtered, and was then ready for use in the same fashion as was described above for FDMA-TBMA.

It should be noted that the resorcinarene, FOMA:TBMA and FDMA:TBMA random and block copolymers are chemically amplified resists. Within embodiments of the present invention, this attribute of these resists can be particularly desirable since they enable the expose photoresist step 8 to be performed through the application of a relatively low energy UV light exposure (typically under 100 mJ/cm$^2$). This is particularly important since many organic materials useful in forming the one or more organic layers 24 will decompose in the presence of UV light and therefore, reduction of the energy during this step permits the photoresist to be exposed 8 without causing significant damage to the underlying one or more organic layers 24. Further, due to the high fluorine content in each of these photoresists, they are both hydrophobic and oleophobic. That is, the resulting material repels or resists both water and most organic solvents, permitting these materials to serve as an in-process encapsulation layers to protect the underlying organic materials from moisture and damage from organic solvents.

Fluorinated solvents appropriate for use of the first, second or third fluorinated solvent is perfluorinated or highly fluorinated liquids, which are typically immiscible with organic solvents and water. Among these solvents are one or more hydrofluoroethers (HFEs) such as methyl nonafluorobutyl ether, methyl nonafluoroisobutyl ether, isomeric mixtures of methyl nonafluorobutyl ether and methyl nonafluoroisobutyl ether, ethyl nonafluorobutyl ether, ethyl nonafluoroisobutyl ether (HFE 7100), isomeric mixtures of ethyl nonafluorobutyl ether and ethyl nonafluoroisobutyl ether (HFE 7200), 3-ethoxy-1,1,1,2,3,4,4,5,5,6,6,6-dodecafluoro-2-trifluoromethyl-hexane (HFE 7500), 1,1,1,2,2,3,4,5,5,5-decafluoro-3-methoxy-4-trifluoromethyl-pentane, 1,1,1,2,3,3-hexafluoro-4-(1,1,2,3,3,3,-hexafluoropropoxy)-pentane (HFE 7600) and combinations thereof. The fluorinated solvent may also be selected from a broad range of fluorinated solvents, such as chlorofluorocarbons (CFSs): $C_xCl_yF_z$, hydrochlorofluorocarbons (HCFCs): $C_xCl_yF_zH_w$, hydrofluorocarbons (HFCs): $C_xF_yH_z$, purfluorocarbons (FCs); $C_xF_y$, hydrofluoroethers (HFEs): $C_xH_yOC_zF_w$, perfluoroethers: $C_xF_yOC_zF_w$, purfluoroamines: $(C_xF_y)_3N$, trifluoromethyl (CF3)-substituted aromatic solvents: $(CF_3)xPh$ [benzotrifluoride, bis(trifluoromethyl)benzene]. Other fluorinated solvents are also known and could be equally well applied for use in the first, second, or third fluorinated solvent.

The photoresist solution will typically include the photoresist material as described above in a fluorinated solvent, for example HFE 7500. Additionally, when the photoresist is a chemically amplified resist material, such as a resorcinarene or the FDMA/TBMA copolymer, this solution will additionally contain a photoacid generator. An appropriate photoacid generator is 2-[1-methoxy]propyl acetate (PGMEA).

Generally, it is desirable that the first fluorinated solvent have a higher boiling point than the second and third fluorinated solvent. Generally, the first fluorinated solvent will typically have a boiling point above 110 degrees Celsius while the second and third fluorinated solvents will have a boiling point below 110 degrees Celsius. For example, the first solvent can include HFE 7500 having a boiling point of 131 degrees Celsius at atmospheric pressure while the second and third solvents can include HFE 7200 having a boiling point of 76 degrees Celsius at atmospheric pressure. The selection of these boiling points in this way is necessary to reduce any of the first fluorinated solvent remaining after the first baking step from being evaporated during later baking steps, which would reduce the dimensional stability of the first pattern of exposed photoresist material. Further, any baking or drying step performed after the expose photoresist step 8 should be performed at a temperature less than the boiling point of the first fluorinated solvent and typically under 100 degrees Celcius.

The third fluorinated solvent will typically include a solubilizing agent to permit the pattern of exposed photo-patternable material to become soluble in the fluorinated solvent. For example, materials such as a silazine, for example hexamethyldisilazane (HMDS; 1,1,1,3,3,3-hexamethyldisilazane) can be added to the third fluorinated solvent to render the first pattern of exposed photo-patternable material soluble. Such an agent can be added to a fluorinated solvent to form the third solvent, for example the third solvent can contain 5% HMDS and 95% HFE 7200. Other useful solubilizing agents include isopropyl alcohol (IPA) which can be formulated similarly to form a third solvent containing 5% IPA and 95% HFE 7200.

As noted earlier, a portion of the photoresist can be exposed to radiation to form a first pattern of exposed fluorinated photoresist material and a second pattern of unexposed photoresist material. For example, an ultraviolet lamp having a wavelength of 248 nm can be used to radiate the photoresist or a lamp with another wavelength, for example 365 nm can be applied. Experiments have verified that when the photoresist is formed from resorcinarene, an exposure of an exposure of 84 mJ cm$^2$ at 248 nm is adequate to enable the necessary reaction while a dose of 2700 mJ cm$^2$ is required when the wavelength is 365 nm.

In most devices of the present invention, it is common to employ electron injection layers, electron transport layers, hole blocking layers, light-emitting layers, electron blocking layers, and hole transport layers that have a common thickness regardless of the color of light emission. However, it is known to change the thickness of the diode, particularly in devices having a semitransparent electrode, such as to create optical interference effects which change the distribution of light output and tune the color of light emission. The term "spacer" or "spacer layer" refers directly to a layer of organic or inorganic material which lies between or includes the first and second electrode and is created precisely to tune the distribution and color of light emission by providing a thickness that is different between two different colors of light-emitting elements. Commonly, this spacer layer will include providing a different thickness of an electron transport layer or a different thickness of a transparent conductor within each different color of light-emitting element to affect the color of light emission. Commonly, the spacer layer will be larger for light-emitting elements that emit light at longer wavelengths than for light-emitting elements that emit light at shorter wavelengths. However, it is also possible to employ a spacer having a thickness for the blue light-emitting element that is equal to or longer than for the red light-emitting element wherein the length of the cavity formed for the blue light-emitting element is selected to be equivalent to twice the wavelength of the blue light and the length of the optical cavity formed for the red light-emitting element is selected to be equal to the wavelength of the red light.

The term "aqueous free" refers to an environment having an extremely low moisture content, typically less than 10% relative humidity. Such environments can include environments filled with dry nitrogen.

As noted earlier, the method of the present invention can be applied to either polymeric or small molecule OLED devices. In a first example, a full-color polymeric OLED device was formed to illustrate a method of the present invention. This example includes fabrication of a full color passive matrix device with light emitting elements of 20 by 20 □m in size with spacing between segments of both the first and second electrodes of 20 □m. Several steps in the device creation are schematically shown in FIG. 2 and the process flow is provided in FIG. 3.

Figure 2A:
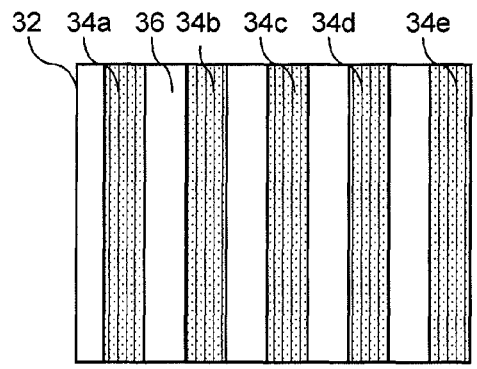
FIG. 2A-2L a top view of a device at various stages of development within a process according to an embodiment of the present invention.
Figure 2B:
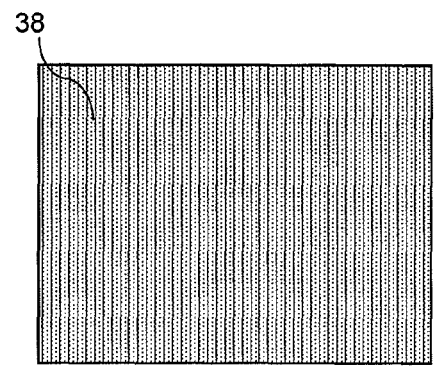
Figure 2C:
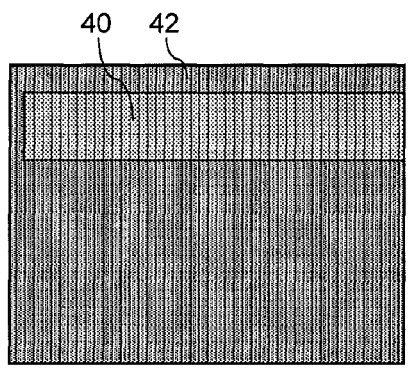
Figure 2D:
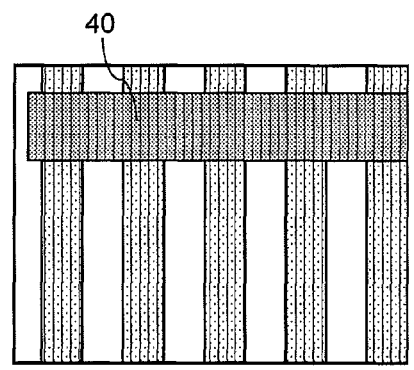
Figure 3:
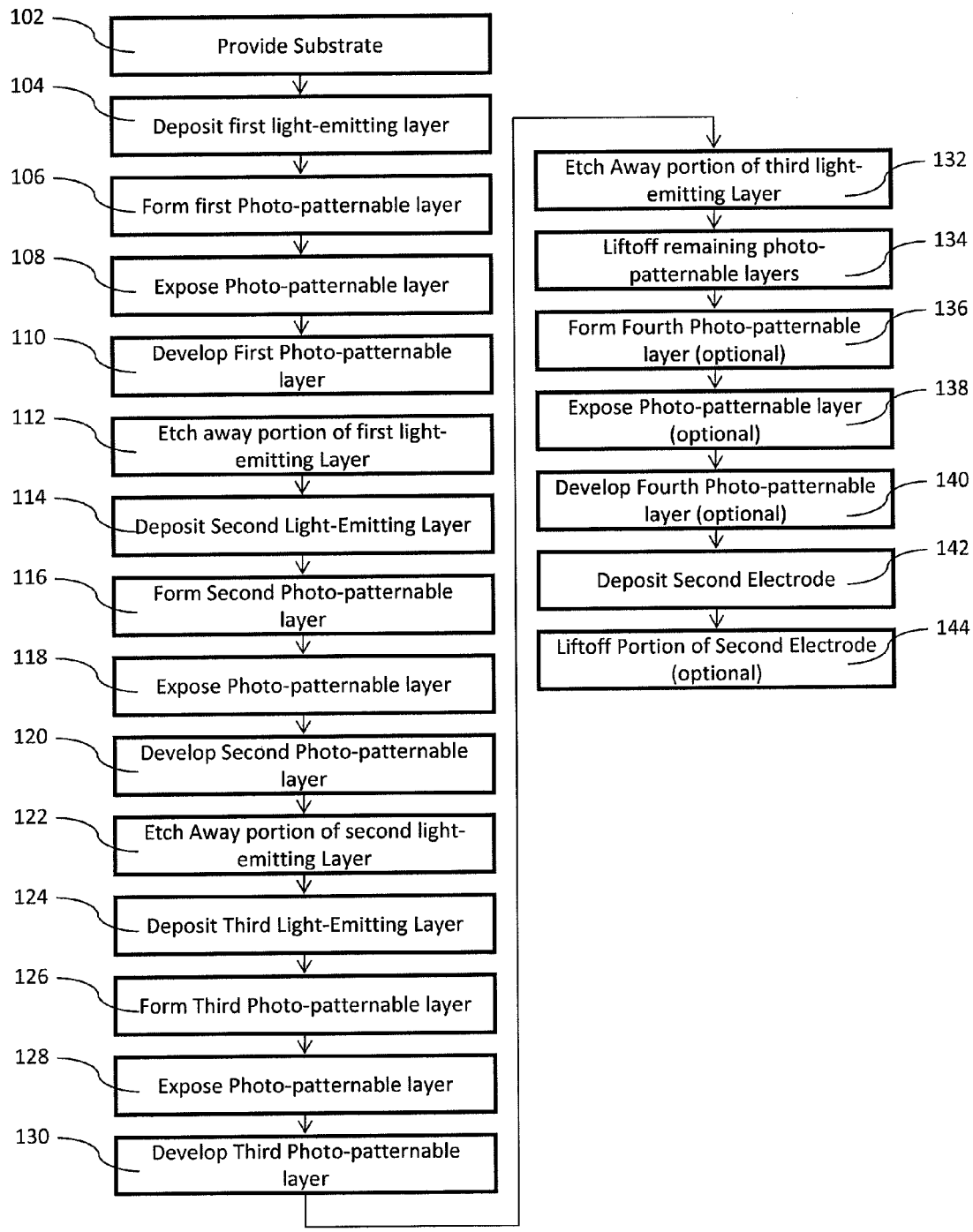
FIG. 3 a flow chart depicting the steps of a method of the present invention used to form a full-color polymeric OLED device.

As shown in FIG. 2A, first a substrate 32, specifically glass with first electrode segments 34a, 34b, 34c, 34d, 34e of patterned ITO, was provided 102. These segments were separated by 20 mm gaps, such as gap 36, which separates segment 34a and 34b. This substrate 32 was cleaned by non-ionic detergent and deionized water followed by a 10 minute UV ozone treatment. A 40 nm thin film of PEDOT:PSS was spin-coated at 3000 rpm onto the substrate 2 to serve as an electron transport layer and baked at 180 degrees Celsius for 40 minutes in air. A 100 nm thin film of green light emitting polymer, namely poly[(9,9-dioctylfluorenyl-2,7-diyl)-co-(1, 4-benzo-{2,1',3}-thiadiazole) or F8BT (Mw 75K) was spin-coated onto the PEDOT:PSS film at 1000 rpm from a concentration of 15 mg/mL in anhydrous p-xylene, and further baked at 130° C. for 15 minutes in an inert nitrogen environment. Through deposition of the PEDOT:PSS and F8BT, a first light-emitting layer, shown as 38 in FIG. 2B, was deposited 104 on the substrate 32. A fluorinated photoresist solution containing the FDMA:TBMA copolymer was then spin-coated over the organic green light-emitting layer and dried to form 106 a first photo-patternable layer. The photo-patternable layer was then selectively exposed 108 to radiation, such that a first portion of the photo-patternable layer was exposed to radiation forming a first pattern of exposed fluorinated photoresist material 40 in FIG. 2C while a second portion of the photo-patternable layer was not exposed to radiation, forming a second pattern of unexposed fluorinated photoresist material 42 in FIG. 2C and further baked. In this case, the first pattern of exposed fluorinated photoresist 40 in FIG. 2C was selected such that it covered and protected the portions of the bilayer of PEDOT:PSS and F8BT. The photoresist film was then patterned by developing 110 it in HFE 7200 to remove the second pattern of unexposed fluorinated photoresist material 42. The substrate then underwent an O2-plasma etch, which etched away 112 and removed the bilayer of PEDOT:PSS and F8BT (i.e., the first light-emitting layer) in the areas that were not protected by the first pattern of exposed fluorinated photoresist, resulting in a substrate shown in FIG. 2D. As such, a portion of the first light-emitting layer, specifically the portion which was directly under the second pattern of unexposed fluorinated photoresist material was removed 14.

Figure 2E:
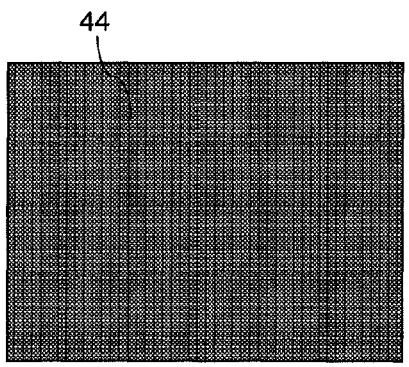
Figure 2F:
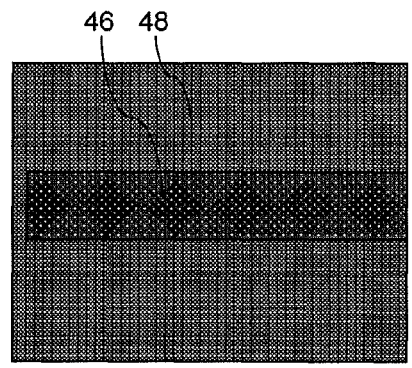
Figure 2G:
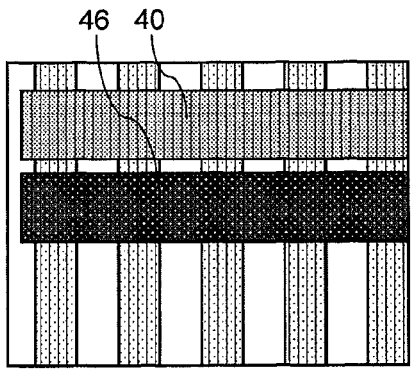

Another 40 nm thin film of PEDOT:PSS was spin-coated at 3000 rpm onto the substrate 32 to serve as an electron transport layer and baked at 180 degrees Celsius for 40 minutes in air. A red light-emitting polymer, specifically F12TBT was then spin-coated onto the substrate 32 to deposit 114 a second organic light-emitting layer 44 as shown in FIG. 2E. A fluorinated photoresist solution containing the FDMA:TBMA copolymer was then deposited 116 by spin-coating over the organic red light-emitting layer and dried to form a second photo-patternable layer. The photo-patternable layer was then selectively exposed 118 to radiation, such that a first portion of this second photo-patternable layer was exposed to radiation while a second portion of this second photo-patternable layer was not exposed to radiation and further baked to create a third pattern of exposed fluorinated photoresist material 46 and a fourth pattern of unexposed fluorinated photoresist material 48 as shown in FIG. 2F. In this case, the fourth pattern of unexposed fluorinated photoresist 48 was selected such that it was aligned with the areas of the substrate that were intended to include the red light-emitting elements. The photoresist film was then patterned by developing 120 it in HFE 7200 to remove the fourth pattern of unexposed fluorinated photoresist material. The substrate then underwent an O$_2$-plasma etch 122, which removed the bilayer of PEDOT:PSS and F12TBT in the areas that were not protected by the third pattern of exposed fluorinated photoresist, leaving the third pattern of exposed fluorinated photoresist 46 which protected the underlying second organic light-emitting layer for emitting red light as shown in FIG. 2G. As shown, the remaining first pattern of exposed fluorinated photoresist 40 continued to protect the underlying organic light-emitting layer for emitting green light.

Figure 2H:
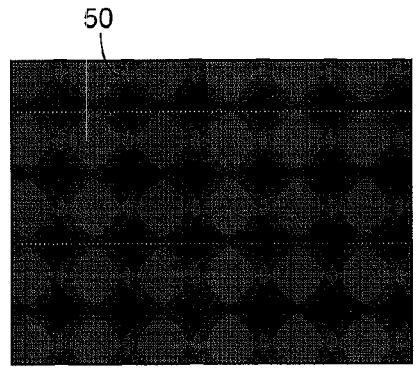
Figure 2I:
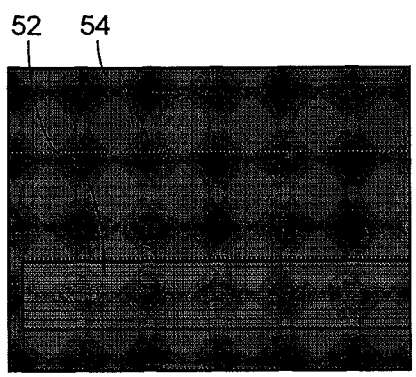
Figure 2J:
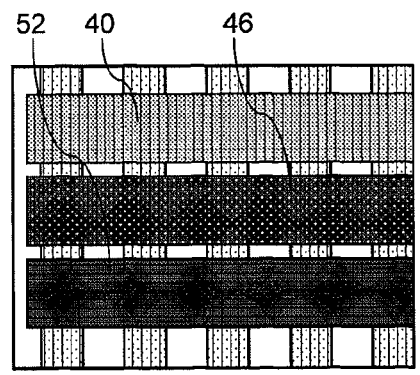

Another 40 nm thin film of PEDOT:PSS was spin-coated at 3000 rpm onto the substrate 32 to serve as an electron transport layer and baked at 180 degrees Celsius for 40 minutes in air. A blue light-emitting polymer, specifically F8, poly(9,9-dioctylfluorene) was then spin-coated onto the substrate 32 to deposit 124 a third light-emitting layer 50 as shown in FIG. 2H. A fluorinated photoresist solution containing the FDMA:TBMA copolymer was then deposited 124 by spin-coating the photoresist solution over the organic red light-emitting layer and dried to form 126 a third photo-patternable layer. The photo-patternable layer was then selectively exposed 128 to radiation, such that a first portion of this second photo-patternable layer was exposed to radiation while a second portion of this second photo-patternable layer was not exposed to radiation and further baked to create a fifth pattern of exposed fluorinated photoresist material 52 and a sixth pattern of unexposed fluorinated photoresist material 54 as shown in FIG. 2F. In this case, the sixth pattern of unexposed fluorinated photoresist 54 was selected such that it was aligned with the areas of the substrate, specifically the first electrode segments, that were intended to include the blue light-emitting elements. The photoresist film was then patterned by developing 130 it in HFE 7200 to remove the fourth pattern of unexposed fluorinated photoresist material. The substrate then underwent an O2-plasma etch 132, which removed the bilayer of PEDOT:PSS and F12TBT in the areas that were not protected by the third pattern of exposed fluorinated photoresist, leaving the fifth pattern of exposed fluorinated photoresist 52 which protected the underlying organic light-emitting layer for emitting blue light as shown in FIG. 2J. As shown, the remaining first pattern of exposed fluorinated photoresist 40 continued to protect the underlying organic light-emitting layer for emitting green light and the remaining third pattern of exposed fluorinated photoresist 46 continued to protect the underlying organic light-emitting layer for emitting red light. The remaining resist films were then lifted off 134 washed away in a third solvent containing 10% hexamethyldisilazane (HMDS) by volume and HFE 7100 mixture. This removed the photoresist layers from the organic light-emitting layers.

Figure 2K:
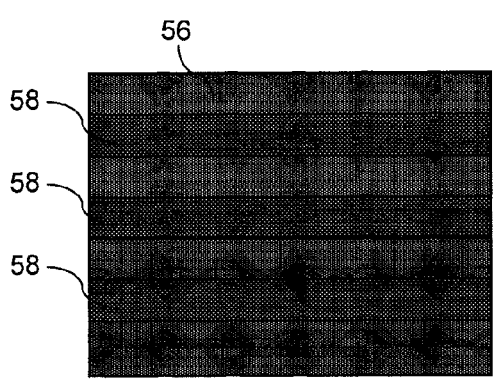
Figure 2L:
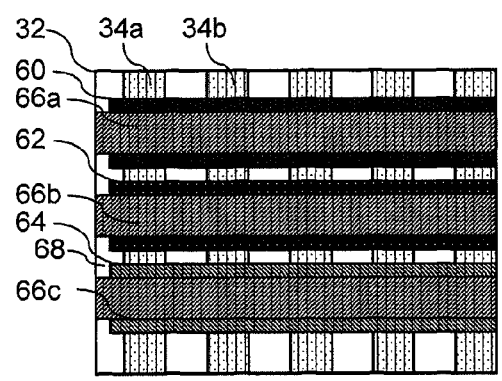

To complete the device a fourth layer of photoresist solution was spin-coated onto the substrate to form 136 a fourth photo-patternable layer. The photo-patternable layer was then selectively exposed 138 to radiation, such that a first portion of this fourth photo-patternable layer was exposed to radiation while a second portion of this fourth photo-patternable layer was not exposed to radiation and further baked to create a seventh pattern of exposed fluorinated photoresist material 56 and a eighth pattern of unexposed fluorinated photoresist material 58 as shown in FIG. 2K. In this case, the seventh pattern of exposed fluorinated photoresist was patterned to correspond to breaks between segments of the second electrode while the eight pattern of unexposed fluorinated photoresist was patterned to correspond to segments of the second electrode which were perpendicular to the first electrode segments. The photoresist film was then patterned by developing 140 it in HFE 7200 to remove the eighth pattern of unexposed fluorinated photoresist material. A 1 nm film of Cesium Fluoride (CsF) and 40 nm film of Aluminum (AL) was then deposited 142 onto the substrate to form the second electrode. Finally, the substrate was exposed to the third solvent containing a mixture of 10% hexamethyldisilazane (HMDS) by volume and HFE 7100 to liftoff 144 and remove the seventh pattern of exposed fluorinated photoresist, leaving a segmented second electrode that served as a cathode for the diodes in the device. Note that steps 136, 138, and 144 were necessary to pattern this second electrode since this was a passive matrix device. If the device would have been an active matrix device with drive circuits and segmented electrodes on the substrate, these steps would not be required.

Figure 4A:
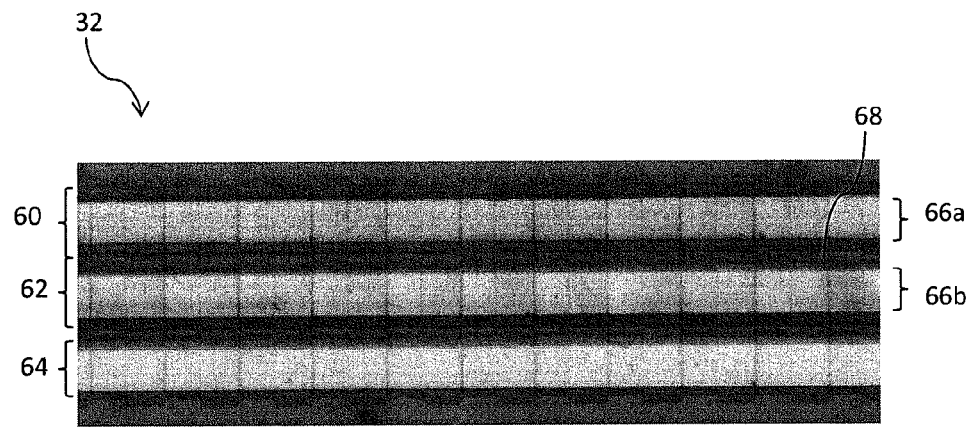
FIG. 4A an image of a device formed using the method shown in FIG. 3.
Figure 4B:
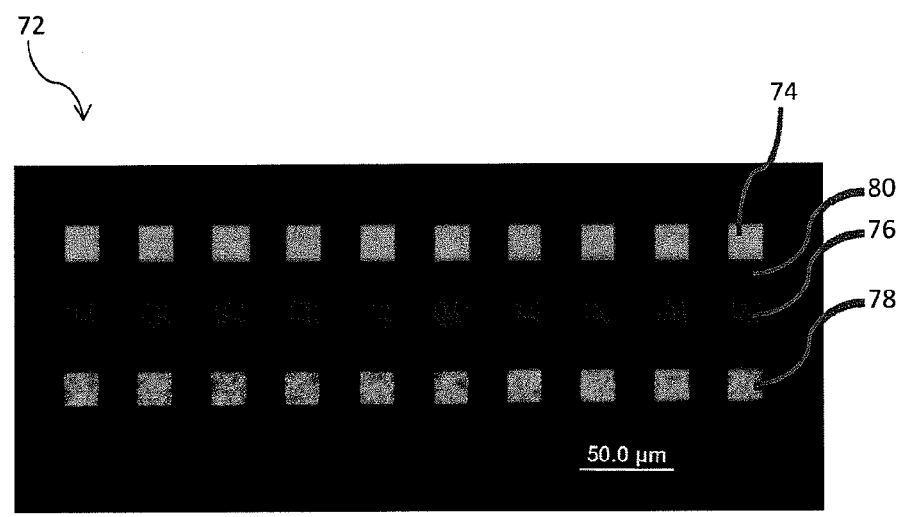
FIG. 4B an image of a device, producing green, red, and blue light that was formed using the method shown in FIG. 3.

Using this method, a full-color, passive-matrix, polymer-based organic device was formed which included a substrate 32 having multiple segments 34*a*, 34*b* of a first electrode, a first organic light emitting layer 60 for emitting a first color of light, a second organic layer 62 for emitting a second color of light, a third light emitting layer 64 for emitting a third color of light. Each of these light-emitting layers 60, 62, 64 were in direct electrical contact with one or more first electrode segments 34*a*, 34*b*. Second electrode segments 66*a*, 66*b*, 66*c* were deposited over and in direct electrical contact with the organic layers with a gap 68 between neighboring second electrode segments 66*b*, 66*c*. An image of this device viewed in reflection is shown in FIG. 4A. A second image of this same device when lit by applying a voltage differential between the first and second electrodes is shown in FIG. 4B As shown, the device 72 includes light emitting elements for emitting green light 74, light-emitting elements for emitting red light 74 and light-emitting elements for emitting blue light 78. Additionally, these light-emitting elements are separated by the distance between the second electrode segments.

In the polymer OLED example, the photoresist was spin-coated directly over the light-emitting layer. However, in devices formed using small molecule OLEDs, Van der Waals forces between neighboring molecules are significantly smaller than between the polymer molecules. Therefore, these materials are more easily disturbed during the deposition (e.g., spin-coating) of the photoresist materials. For this reason, it can be advantageous to deposit a layer of material over the organic materials with a larger intermolecular force before spin-coating a photoresist over the small molecule materials. For this reason, it can be useful to, for example, deposit not only the light-emitting layer but at least a portion of the second electrode over the organic materials before spin-coating photoresist over the light-emitting layer. Therefore, a method, such as the method shown in the flow chart of FIG. 5 can be applied. Select steps of this method are shown in the process diagrams of FIGS. 6A-6P.

Figure 5:
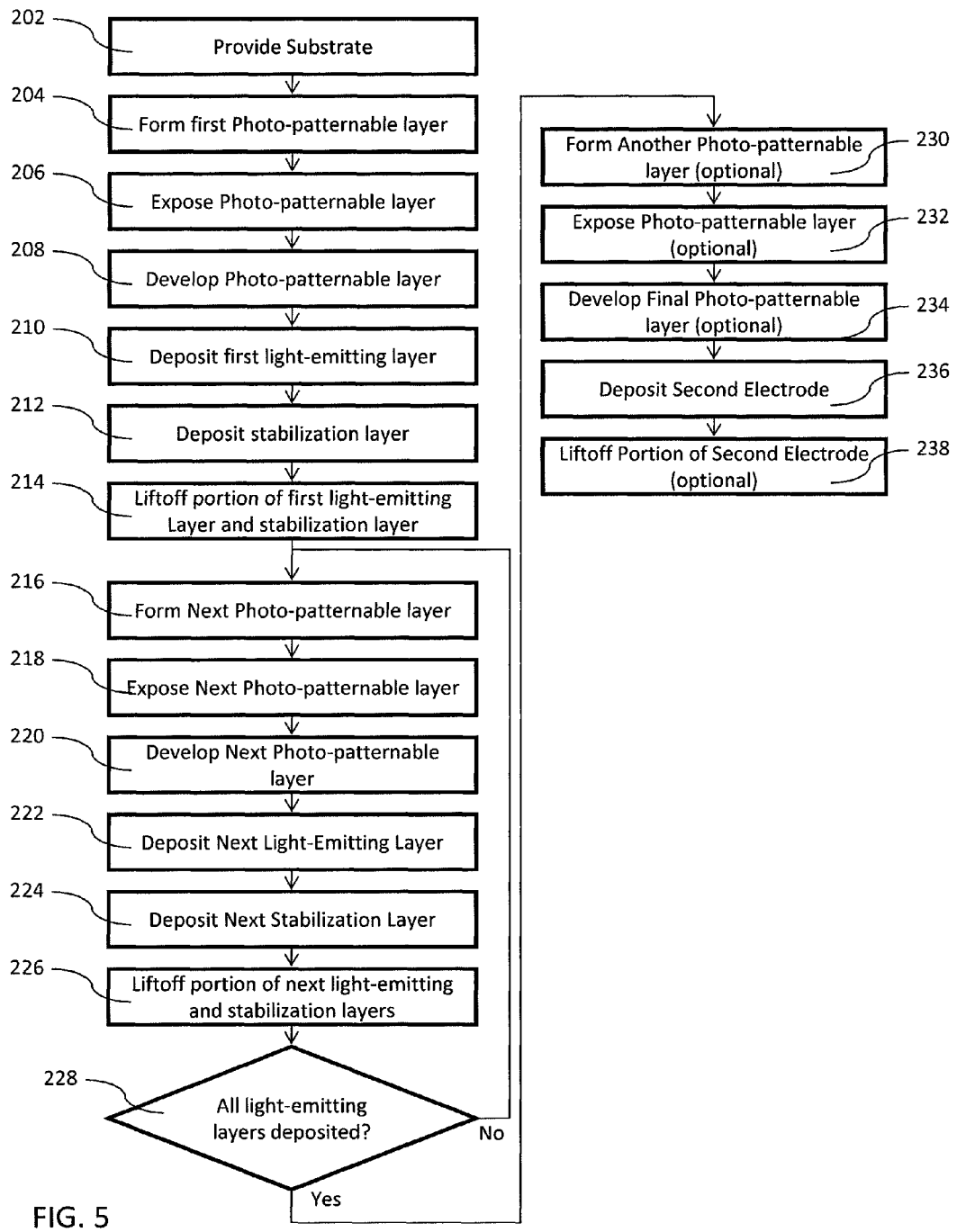
FIG. 5 a flow chart depicting the steps of a method of the present invention useful in forming a full-color, small-molecule, OLED device.
Figure 6A:
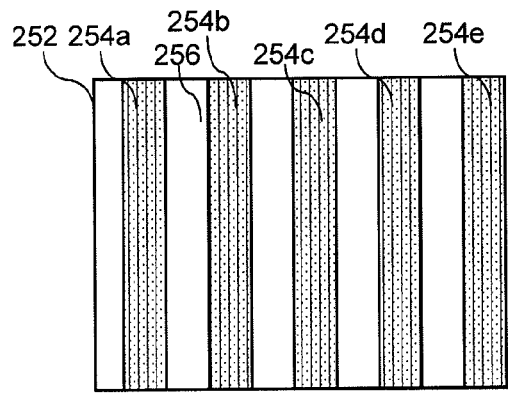
FIG. 6A-6P top views of a device at various stages of development within a process according to an embodiment of the present invention.
Figure 6B:
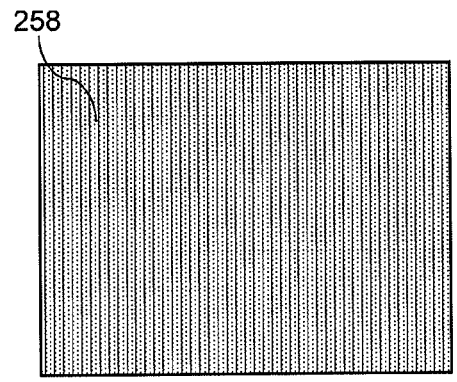
Figure 6C:
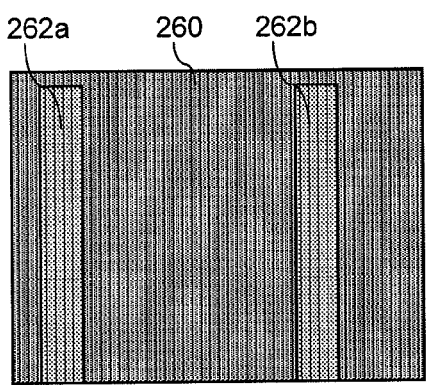
Figure 6D:
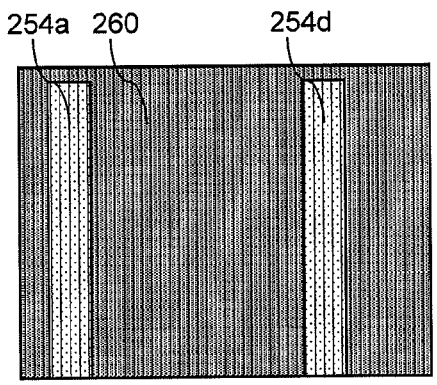
Figure 6E:
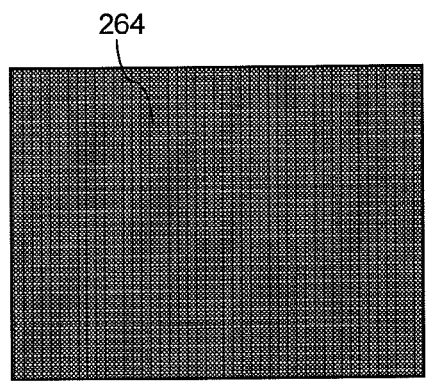
Figure 6F:
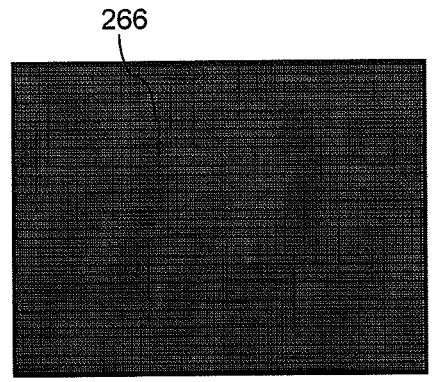

As shown in FIG. 5 and FIG. 6A, this method begins by providing 202 a substrate 252. This substrate 252 includes a first electrode 254, which in this particular embodiment is segmented into first electrode segments 254*a*, 254*b*, 254*c*, 254*d*, 254*e*. Each segment of the first electrode can be separated from the other segments; for example, segments 254*a*, and 254*b* are separated by a space 256, such that the voltage and flow of current through each segment can be independently controlled. The first photo-patternable layer 258 can then be formed 204 over the substrate 252 by depositing a fluorinated photoresist over the substrate 252 as shown in FIG. 6B. The photo-patternable layer can then be exposed 206 to radiation to form a first pattern of exposed fluorinated photoresist material 260 and a second pattern of unexposed fluorinated photoresist material 262*a*, 262*b*. The photo-patternable layer can then be developed 208 in the second fluorinated solvent, leaving the first pattern of exposed fluorinated photoresist material 260 on the substrate but removing the second pattern of unexposed fluorinated photoresist material 262*a*, 262*b*, and exposing at least portions of the first electrode, for example portions of segments 254*a* and 254*d* as shown in FIG. 6D.

A first light-emitting layer 264 can then be deposited 210 over the substrate 252 and the first pattern of exposed fluorinated photoresist material 260. In the case of a small-molecule OLED device, this light-emitting layer will preferably include several layers of small molecule organic materials that are vapor deposited in a vacuum. Therefore, the substrate 252 will be placed into a vacuum coater and preferably coated with at least an electron transport layer, a doped light-emitting layer for emitting a first color of light, and a hole transport layer. In a particularly preferred embodiment, the thickness of the first electron transport layer can be selected to provide a first electron transport layer thickness that is adjusted to provide a cavity length that is a multiple of the peak wavelength of the first color of light.

Figure 6G:
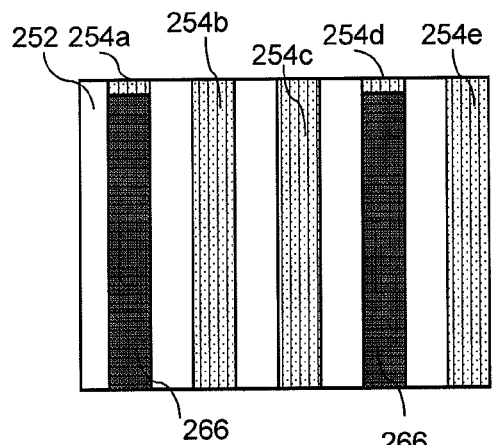

In this embodiment, a first stabilization layer 266 can then be deposited 212. This stabilization layer can be formed of a material that is deposited over the small molecule organic materials to provide stability to the stack of small molecule organic materials to prevent them from becoming damaged due to mechanical stresses that arise due to spin coating of an additional photo-patternable layer. This stabilization layer can be formed, for example from a conductive metal or a semi-transparent, conductive, doped metal oxide. The thickness of this stabilization layer will preferably be greater than 5 nm and less than 200 nm. The substrate 252 can then be exposed to the third fluorinated solvent to liftoff 214 the first pattern of exposed photoresist material 260 together with the portions of the light-emitting layer 264 and the stabilization layer 266, leaving only the portions of the light-emitting layer 264 and stabilization layer 266, which are directly deposited in direct electrical contact with the electrode segments 254a and 254d, as shown in FIG. 6G. As shown in this figure, the light-emitting layer 264 and stabilization layer 266 each cover a portion of each electrode segment, while a portion of each segment is not coated by the stabilization layer to permit direct electrical connection to the electrode segment 254a, 254d, without forming a direct electrical connection to the stabilization layer 266, which is particularly important when the stabilization layer 266 can be formed from a conductive material.

Figure 6H:
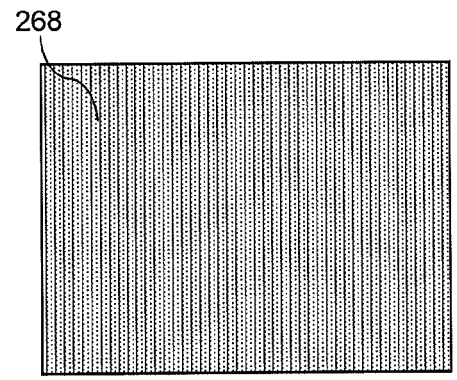
Figure 6I:
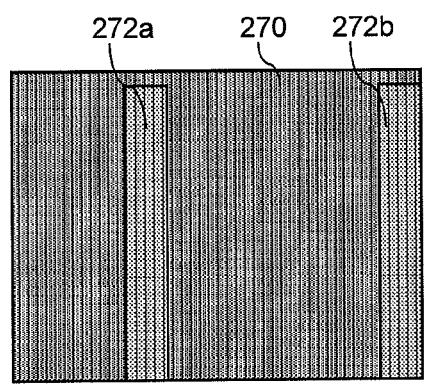
Figure 6J:
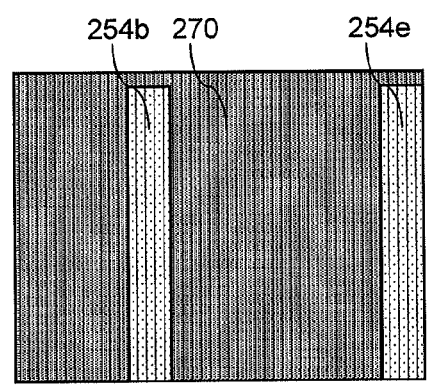

The next (e.g., second) photo-patternable layer 268 can then be formed 216 over the substrate 252 as shown in FIG. 6H and exposed 218 to radiation to form a third pattern of exposed photoresist material 270 and a fourth pattern of unexposed photoresist material 272 wherein the spatial arrangement of the third pattern of exposed photoresist material 270 is different than the spatial arrangement of the first pattern of exposed photoresist material 260 and the spatial arrangement of the fourth pattern of unexposed photoresist material 272a, 272b is different from the spatial arrangement of the second pattern of unexposed photoresist material 262a, 262b. The photoresist material can then be exposed to the second fluorinated solvent to develop 220 this next photo-patternable layer and expose portions of the first electrode segments 254b, 254e, leaving only the third pattern of exposed photoresist material 270 over the substrate 252 as shown in FIG. 6J.

Figure 6K:
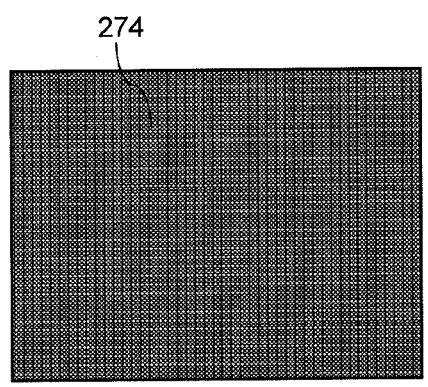
Figure 6L:
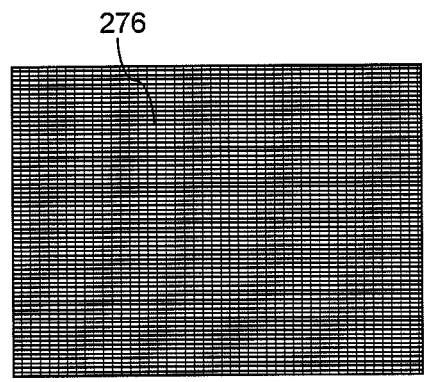

The second light-emitting layer 274 can then be deposited 222 over the substrate 252 and the third pattern of exposed fluorinated photoresist material 270 as shown in FIG. 6K. In the case of this small-molecule OLED device, this light-emitting layer will once again include several layers of small molecule organic materials that are vapor deposited in a vacuum. Therefore, the substrate 252 can be placed into a vacuum coater and preferably coated with at least a second electron transport layer, a second doped light-emitting layer for emitting a second color of light, and a second hole transport layer. In a particularly preferred embodiment, the thickness of the second electron transport layer will be different from the thickness of the first electron transport layer and will be selected to provide a first electron transport layer thickness that is adjusted to provide a cavity length that is a multiple of the peak wavelength of the second color of light. A second stabilization layer 276 as shown in FIG. 6L can then be deposited 224 over the substrate 252.

Figure 6M:
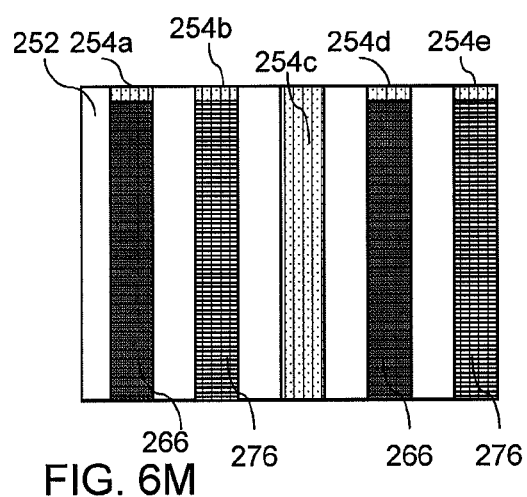

The third pattern of exposed fluorinated photoresist material 276 can then be lifted off, removing the portion of the second light-emitting layer 274 and the second stabilization layer 276, leaving the remaining portions of the second light-emitting layer, which is protected by the remaining portions of the second stabilization layer 276 as shown in FIG. 6M.

Figure 6N:
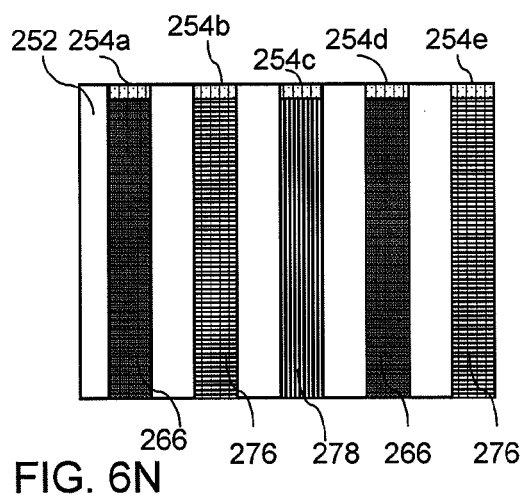

A decision 228 is made as to whether all of the light-emitting layers have been deposited. If not, steps 216 through 226 are repeated wherein a fifth pattern of exposed photoresist material and a sixth pattern of unexposed photoresist material are formed 216, exposed 218, and developed 220. A third light-emitting layer 222 for emitting a third color of light can be deposited 222, ideally including a third electron transport layer having a third thickness selected to form a cavity length equal to a multiple of the peak wavelength of the light that is emitted by the third light-emitting layer. A third stabilization layer can then be deposited 224 over this light-emitting layer and the fifth pattern of unexposed photoresist is removed, lifting off 226, a portion of the light-emitting layer and the stabilization layer, leaving the portions shown as 278 in FIG. 6N.

Figure 6O:
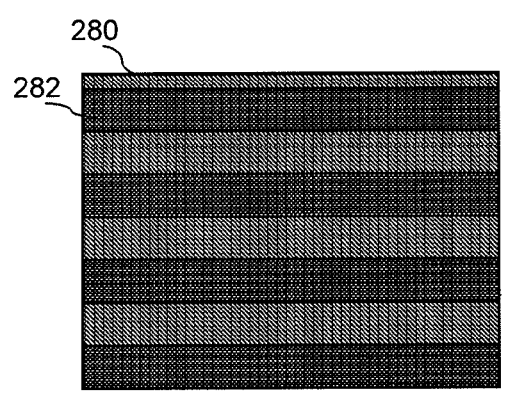
Figure 6P:
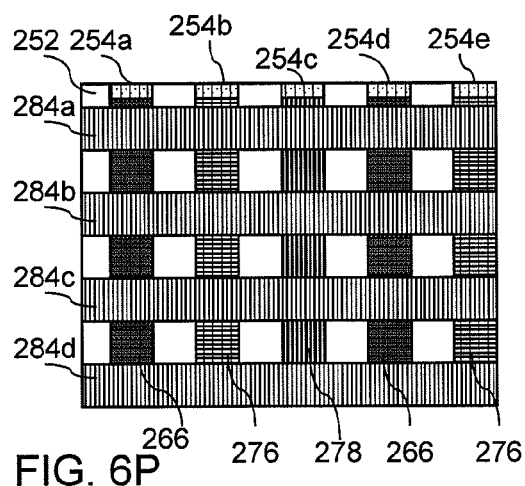

A second electrode can then be deposited 236 over the substrate. If the device is an active matrix device with drive circuits formed on the substrate, the second electrode can be blanket deposited over the substrate, protecting only the exposed portions of the first electrodes from being coated. However, when the device is a passive matrix device, another photo-patternable layer can be formed 230 on the substrate 252. This photo-patternable layer can be exposed 232 to radiation to create a seventh pattern of exposed photoresist material 280 and an eighth pattern of unexposed photoresist material 282 as shown in FIG. 6O. The photo-patternable layer can be developed 234. The conductor to form the second electrode can then be deposited 236 over the substrate and the seventh pattern of exposed photoresist material. Finally, the seventh pattern of exposed photoresist material and the portion of the second electrode deposited directly over this pattern can be removed by lifting off 238 the seventh pattern of exposed photoresist material to create the device structure shown in FIG. 6P having a second electrode that is formed as segments 284a, 284b, 284c, 284d that are orthogonal to the first electrode segments 254a, 254b, 254c, 254d, and 254e.

Figure 7A:
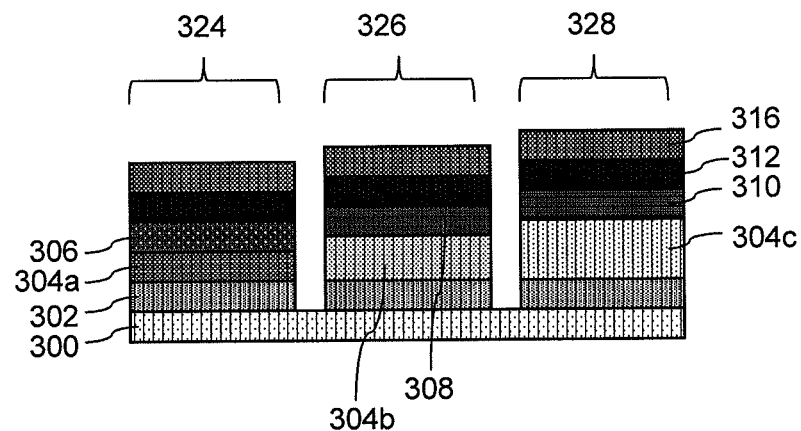
FIG. 7A a cross-section of a three-color, small-molecule OLED device constructed using a method of the present invention.
Figure 7B:
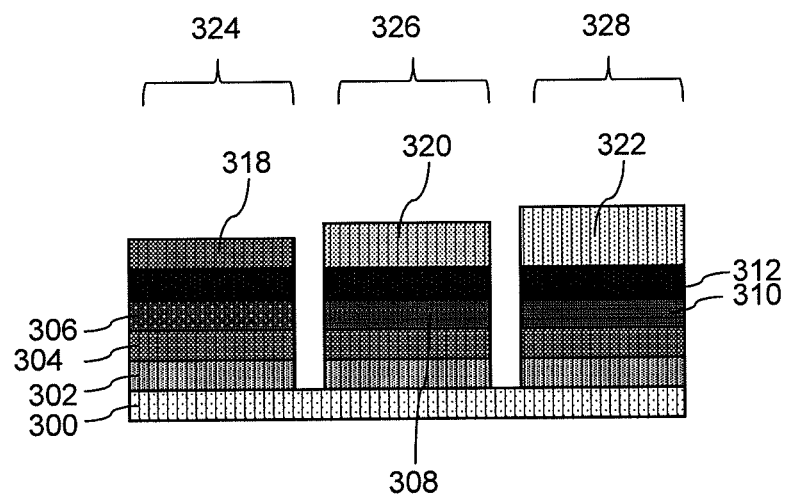
FIG. 7B a cross section of another three-color, small-molecule OLED device constructed using a method of the present invention.

Within one arrangement of this OLED device, at least the first and second electron transport layers within the first and second light-emitting layers 264, 274 each can have different thicknesses. While this is a preferred method of adjusting the cavity length of different light-emitting elements, the thickness of other layers can alternately be adjusted. In another approach, the first 266 and second 276 stabilization layers can be formed of a transparent material, such as a doped metal oxide and the thickness of these first 266 and second 276 stabilization layers can be different from one another to adjust the thickness of the cavity such that it is different for the first light-emitting elements and the second light-emitting elements. Examples are shown in FIGS. 7A and 7B. FIGS. 7A and 7B each show a cross-section of a device developed using this method, each including three light-emitting elements 324, 326, 328 each light-emitting element emitting a different color of light. Each device includes a substrate 300 on which first electrode segments 302 are formed. Additionally, each device has three different light-emitting layers 306, 308, 310 for emitting three different colors of light, each corresponding to a different light-emitting element 324, 326, 328, respectively. Additionally, each light-emitting element has a hole transport layer 312. Each light-emitting element also includes an electron transport layer and a stabilization layer. In the device shown in FIG. 7A, the stabilization layer in each device light-emitting element is shown as being similar, i.e., having the same thickness and composition. However, in this device, each light-emitting element has a unique electron transport layer 304a, 304b, and 304c. These electron transport layers can differ in thickness. They can also differ according to other properties, such as material composition. The device in FIG. 7b includes electron transport layers 304 that are the same for each of the three light-emitting elements. However, in the device of this figure, the stabilization layer is transparent and varies in thickness within each light-emitting element 324, such that the thickness increases between stabilization layer 318 and 320 and again between 320 and 322.

To demonstrate compatibility of such a process and materials with small molecule organic structures, a single-color passive matrix device was constructed. This device included a substrate having segments of ITO patterned onto it to form first electrode segments. A photoresist based upon resorcinarene dissolved in HFE 7500 with PGMEA was spin coated over the substrate. This substrate subsequently underwent a postbake, was exposed to UV radiation to form a first pattern of exposed photoresist in regions outside of the desired light-emitting areas and a second pattern of unexposed photoresist in the regions of the substrate in which light-emission was desired. The substrate was then baked a second time. The photoresist was then developed in HFE 7500. Small molecule light-emitting material, including an electron transport layer of N,N'-di(naphthalene-1-yl)-N,N'-diphenyl-benzidine (NPB) and a layer of tris-(8-hydroxyquinolinato) aluminium(III) (Alq3), which served as the light-emitting layer and hole transport layer, was then deposited over the substrate. A bi-layer film of CesiumFluoride (CsFl) and Aluminum was then coated over the organic layers to form both a stabilization layer and the second electrode. The substrate was then washed in a solution containing a combination of HFE 7200 and HMDS to liftoff first pattern of exposed photoresist material together with the organic materials and the portion of the second electrode that was coated over the first pattern of exposed photoresist material. This experiment resulted in a passive-matrix, small-molecule OLED device having light-emitting elements that were 10 ☐m square and that efficiently emitted green light only within the regions in which the second pattern of unexposed photoresist material was deposited. This experiment clearly demonstrated the ability to liftoff the organic materials and a stabilization layer or second electrode within only desired areas, providing a device with very small light-emitting elements that efficiently emitted light. Therefore, the method of the present invention enables the creation of high resolution OLED devices with patterned organic materials that function to provide highly efficient electron to photon conversion.

The invention has been described in detail with particular reference to certain preferred embodiments thereof, but it will be understood that variations and modifications can be effected within the spirit and scope of the invention.

PARTS LIST 2 provide substrate step
4 deposit common organic layers step (optional)
6 form first photo-patternable layer step
8 expose first photo-patternable layer step
10 develop first photo-patternable layer step
12 deposit light-emitting layer step
14 pattern light-emitting layer step
16 form second photo-patternable layer step
18 expose second photo-patternable layer step
20 develop second photo-patternable layer step
22 deposit second light-emitting layer step
24 pattern second light-emitting layer step
26 decision step
28 deposit second electrode step
32 substrate
34a first electrode segment
34b first electrode segment
34c first electrode segment
34d first electrode segment
34e first electrode segment
36 gap
38 first light-emitting layer
40 first pattern of exposed fluorinated photoresist material
42 second pattern of unexposed fluorinated photoresist material
44 second light-emitting layer
46 third pattern of exposed fluorinated photoresist material
48 fourth pattern of unexposed fluorinated photoresist material
50 third light-emitting layer
52 fifth pattern of exposed fluorinated photoresist material
54 sixth pattern of unexposed fluorinated photoresist material
56 seventh pattern of exposed fluorinated photoresist material
58 eighth pattern of unexposed fluorinated photoresist material
60 first light-emitting layer
62 second light-emitting layer
64 third light-emitting layer
66a second electrode segment
66b second electrode segment
66c second electrode segment
68 gap
72 device
74 light-emitting element for emitting green light
76 light-emitting element for emitting red light
78 light-emitting element for emitting blue light
102 provide substrate step
104 deposit first light-emitting layer step
106 form first photo-patternable layer step
108 selectively expose step
110 develop first photo-patternable layer step
112 etch first light-emitting layer step
114 deposit second light-emitting layer step
116 deposit second photo-patternable layer step
118 selectively expose second photo-patternable layer step
120 develop second photo-patternable layer step
122 etch second light-emitting layer step
124 deposit third light-emitting layer step
126 form third photo-patternable layer step
128 selectively expose third photo-patternable layer step
130 develop third photo-patternable layer step
132 etch third light-emitting layer step
134 liftoff resist film step
136 form fourth photo-patternable layer step
138 selectively expose fourth photo-patternable layer step
140 develop fourth photo-patternable layer step
142 deposit second electrode step
144 liftoff seventh pattern of exposed fluorinated photoresist material step
202 provide substrate step
204 form first photo-patternable layer step
206 expose first photo-patternable layer step
208 develop first photo-patternable layer step
210 deposit first light-emitting layer step
212 deposit first stabilization layer step 214 liftoff the first pattern of exposed photo-resist material step
216 form second photo-patternable layer step
218 expose second photo-patternable layer step
220 develop second photo-patternable layer step
222 deposit second light-emitting layer step
224 deposit second stabilization layer step
226 liftoff the third pattern of exposed photo-resist material step
228 decision step
230 form photo-patternable layer step
232 expose photo-patternable layer step
234 develop photo-patternable layer step
236 deposit second electrode step
238 liftoff seventh pattern of exposed photoresist material step
252 substrate
254 first electrode
254a first electrode segment
254b first electrode segment
254c first electrode segment
254d first electrode segment
254e first electrode segment
256 space
258 first photo-patternable layer
260 first pattern of exposed fluorinated photoresist material
262a second pattern of unexposed fluorinated photoresist material
262b second pattern of unexposed fluorinated photoresist material
264 first light emitting layer
266 first stabilization layer
268 second photo-patternable layer
270 third pattern of exposed photoresist material
272a fourth pattern of unexposed photoresist material
272b fourth pattern of unexposed photoresist material
274 second light-emitting layer
276 second stabilization layer
278 third stabilization layer
280 seventh pattern of exposed photoresist material
282 eighth pattern of unexposed photoresist material
284a second electrode segment
284b second electrode segment
284c second electrode segment
284d second electrode segment
300 substrate
302 first electrode segment
304a first electron transport layer
304b second electron transport layer
304c third electron transport layer
306 first light-emitting layer
308 second light-emitting layer
310 third light-emitting layer
312 hole transport layer
318 first stabilization layer
320 second stabilization layer
322 third stabilization layer
324 first light-emitting element
326 second light-emitting element
328 third light-emitting element

The invention claimed is:

1. A method of making a multi-color OLED device, including:
   a) applying a photo-patternable layer comprising a fluorinated photoresist material over a patterned first organic light-emitting layer in a substrate;
   b) selectively exposing at least a portion of the photo-patternable layer to a radiation;
   c) developing the photo-patternable layer with a fluorinated solvent to form a patterned layer;
   d) depositing a second organic light-emitting material over the substrate to form a second organic light-emitting layer; and
   e) applying the patterned fluorinated photoresist material to control the removal of a portion of the second organic light-emitting layer,
   the second organic light-emitting layer being deposited after forming the patterned fluorinated photoresist material, and
   the step of applying the patterned fluorinated photoresist material to control the removal of a portion of the second organic light-emitting layer comprising contacting the substrate with a second fluorinated solvent to remove the patterned fluorinated photoresist material and the portion of the second organic light-emitting layer such that a remaining portion of the second organic light-emitting layer is in electrical contact with a patterned electrode.

2. The method of claim 1, wherein the photo-patternable layer is provided over the second organic light-emitting layer, and wherein the step of applying the patterned fluorinated photoresist material to control the removal of a portion of the organic second light-emitting layer includes etching.

3. A method of making a multi-color OLED device, including:
   a) applying a photo-patternable layer comprising a fluorinated photoresist material over a patterned first organic light-emitting layer in a substrate, the photo-patternable layer comprising a fluorinated photoresist material;
   b) selectively exposing at least a portion of the photo-patternable layer to a radiation;
   c) developing the photo-patternable layer with a fluorinated solvent to form a patterned layer;
   d) depositing a second organic light-emitting material over the substrate to form a second organic light-emitting layer; and
   e) applying the patterned fluorinated photoresist material to control the removal of a portion of the second organic light-emitting layer,
   wherein applying the photo-patternable layer over the patterned first organic light-emitting layer in the substrate further includes providing a patterned first stabilization layer over the patterned first organic light-emitting layer, and wherein the photo-patternable layer is provided over the first stabilization layer.

4. The method of claim 3, wherein the first stabilization layer includes a conductive metal or a metal oxide.

5. The method of claim 4, wherein providing the first stabilization layer comprises depositing a stabilization layer of a thickness of greater than about 5 nm and less than about 200 nm.

6. The method of claim 3, further comprising depositing a second stabilization layer over the second organic light-emitting layer.

7. The method of claim 6, wherein depositing the second stabilization layer includes depositing a layer of a conductive metal or metal oxide.

8. The method of claim 1, further comprising depositing an electrode over the first and second light-emitting layers.

9. The method of claim 1, wherein one or more of the steps (a), (b) and (c) are performed in an environment at near atmospheric pressure.

10. The method of claim 9 wherein one or more of the steps (a), (b) and (c) are performed in a dry nitrogen environment.

11. The method of claim 1, wherein the substrate further includes an array of independently-controlled electrode segments.

\* \* \* \* \*